United States Patent
Norris et al.

(10) Patent No.: US 10,250,232 B1
(45) Date of Patent: Apr. 2, 2019

(54) SYSTEMS AND METHODS FOR CYCLOSTATIONARY FEATURE ELIMINATION

(71) Applicant: Harris Global Communications, Inc., Rochester, NY (US)

(72) Inventors: James A. Norris, Fairport, NY (US); John W. Nieto, Rochester, NY (US); Michael A. Wadsworth, Palmyra, NY (US); William N. Furman, Fairport, NY (US)

(73) Assignee: Harris Global Communications, Inc., Rochester, NY (US)

( * ) Notice: Subject to any disclaimer, the term of this patent is extended or adjusted under 35 U.S.C. 154(b) by 0 days.

(21) Appl. No.: 15/996,735

(22) Filed: Jun. 4, 2018

(51) Int. Cl.
*H03H 17/00* (2006.01)
*H04L 27/26* (2006.01)
*H04B 10/2575* (2013.01)
*H03M 1/06* (2006.01)

(52) U.S. Cl.
CPC ... *H03H 17/0027* (2013.01); *H04B 10/25759* (2013.01); *H04L 27/264* (2013.01); *H04L 27/2631* (2013.01); *H04L 27/2678* (2013.01); *H03M 1/0641* (2013.01)

(58) Field of Classification Search
CPC ......... H03H 17/0027; H04B 10/25759; H04L 27/2631; H04L 27/26; H04L 27/2678

USPC ........................................................ 375/355
See application file for complete search history.

(56) References Cited

U.S. PATENT DOCUMENTS

| | | | |
|---|---|---|---|
| 8,428,102 B2 | 4/2013 | Chester et al. | |
| 8,428,103 B2 | 4/2013 | Chester et al. | |
| 8,509,284 B2 | 8/2013 | Michaels et al. | |
| 8,542,716 B2 | 9/2013 | Chester et al. | |
| 2010/0309957 A1* | 12/2010 | Chester ............... | H04J 13/0018 375/146 |

* cited by examiner

*Primary Examiner* — Michael R Neff
(74) *Attorney, Agent, or Firm* — Fox Rothschild LLP; Robert J. Sacco; Carol E. Thorstad-Forsyth

(57) ABSTRACT

Systems (400) and methods for removing dither introduced into a transmitted RF signal. The method comprising: receiving, by a receiver, the transmitted RF signal; converting, by the receiver, the transmitted RF signal into a discrete-time IF signal comprising a sequence of samples, where at least a first sample of said samples has a first sample duration different than a second sample duration of at least a second sample of said samples; and performing operations by a sub-sample dither removal device of the receiver to modify a sample timing of the discrete-time IF signal by decreasing or increasing the first sample duration of the first sample using a digital signal processing technique in a digital domain.

20 Claims, 30 Drawing Sheets

4:1 Interpolation With Four Input Samples X0, X1, X2, X3, Sixteen Output Samples Y0-Y15

| Coefficients | C0 | C1 | C2 | C3 | C4 | C5 | C6 | C7 | C8 | C9 | C10 | C11 | C12 | C13 | C14 | C15 | Result |
|---|---|---|---|---|---|---|---|---|---|---|---|---|---|---|---|---|---|
| First Polyphase Filter Bank 902 | ✓ | | | | ✓ | | | | ✓ | | | | ✓ | | | | Y0=X0*C0<br>Y4=X0*C4+X1*C0<br>Y8=X0*C8+X1*C4+X2*C0<br>Y12=X0*C12+X1*C8+ X2*C4+X3*C0 |
| Second Polyphase Filter Bank 904 | | ✓ | | | | ✓ | | | | ✓ | | | | ✓ | | | Y1=X0*C1<br>Y5=X0*C5+X1*C1<br>Y9=X0*C9+X1*C5+X2*C1<br>Y13=X0*C13+X1*C9+ X2*C5+X3*C1 |
| Third Polyphase Filter Bank 906 | | | ✓ | | | | ✓ | | | | ✓ | | | | ✓ | | Y2=X0*C2<br>Y6=X0*C6+X1*C2<br>Y10=X0*C10+X1*C6+ X2*C2<br>Y14=X0*C14+X1*C10+ X2*C6+X3*C2 |
| Fourth Polyphase Filter Bank 908 | | | | ✓ | | | | ✓ | | | | ✓ | | | | ✓ | Y3=X0*C3<br>Y7=X0*C7+X1*C3<br>Y11=X0*C11+X1*C7+ X2*C3<br>Y15=X0*C15+X1*C11+ X2*C47+X3*C3 |

$$Y_n = \sum_{k=0}^{k=16} C_k X_{n-k}$$

FIG. 9
(Prior Art)

1:1 Interpolation: Decimation with Four Input Samples X0, X1, X2, X3 and Four Output Sample Y0, Y4, Y8, Y12

| Interpolation Result | Discard | Output |
|---|---|---|
| Y0=X0*C0 | | ✓ |
| Y1=X0*C1 | ✓ | |
| Y2=X0*C2 | ✓ | |
| Y3=X0*C3 | ✓ | |
| Y4=X0*C4+X1*C0 | | ✓ |
| Y5=X0*C5+X1*C1 | ✓ | |
| Y6=X0*C6+X1*C2 | ✓ | |
| Y7=X0*C7+X1*C3 | ✓ | |
| Y8=X0*C8+X1*C4+X2*C0 | | ✓ |
| Y9=X0*C9+X1*C5+X2*C1 | ✓ | |
| Y10=X0*C10+X1*C6+X2*C2 | ✓ | |
| Y11=X0*C11+X1*C7+X2*C3 | ✓ | |
| Y12=X0*C12+X1*C8+X2*C4+X3*C0 | | ✓ |
| Y13=X0*C13+X1*C9+X2*C5+X3*C1 | ✓ | |
| Y14=X0*C14+X1*C10+X2*C6+X3*C2 | ✓ | |
| Y15=X0*C15+X1*C11+X2*C7+X3*C3 | ✓ | |

FIG. 10

(Prior Art)

Time Advance 0.25 of a Sample Duration For Sample Sequence X0-X4
Output Samples Z1, Z2, Z3 Come Faster

| Filter Bank | Output | Time Advance | Discard | Result |
|---|---|---|---|---|
| First Polyphase Filter Bank 802 | Y0 | | | |
| | Y4 | | ✓ | |
| | Y8 | | ✓ | |
| | Y12 | | ✓ | |
| Second Polyphase Filter Bank 804 | Y1 | | | $Z0 = X0*C1$ |
| | Y5 | | | $Z1 = X0*C5 + X1*C1$ |
| | Y9 | ✓ | | $Z2 = X0*C9 + X1*C5 + X2*C1$ |
| | Y13 | | | $Z3 = X0*C13 + X1*C9 + X2*C5 + X3*C1$ |
| Third Polyphase Filter Bank 806 | Y2 | | ✓ | |
| | Y6 | | ✓ | |
| | Y10 | | ✓ | |
| | Y14 | | ✓ | |
| Fourth Polyphase Filter Bank 808 | Y3 | | ✓ | |
| | Y7 | | ✓ | |
| | Y11 | | | |
| | Y15 | | | |

Time Advance 0.50 of a Sample Duration For Sample Sequence X0-X4
Output Samples Z1, Z2, Z3 Come Faster

| Filter Bank | Output | Time Advance | Discard | Result |
|---|---|---|---|---|
| First Polyphase Filter Bank 802 | Y0 | | | |
| | Y4 | | ✓ | |
| | Y8 | | ✓ | |
| | Y12 | | ✓ | |
| Second Polyphase Filter Bank 804 | Y1 | | ✓ | |
| | Y5 | | ✓ | |
| | Y9 | | ✓ | |
| | Y13 | | ✓ | |
| Third Polyphase Filter Bank 806 | Y2 | ✓ | | $Z0 = X0*C2$ |
| | Y6 | | | $Z1 = X0*C6 + X1*C2$ |
| | Y10 | | | $Z2 = X0*C10 + X1*C6 + X2*C2$ |
| | Y14 | | | $Z3 = X0*C14 + X1*C10 + X2*C6 + X3*C2$ |
| Fourth Polyphase Filter Bank 808 | Y3 | | ✓ | |
| | Y7 | | ✓ | |
| | Y11 | | ✓ | |
| | Y15 | | ✓ | |

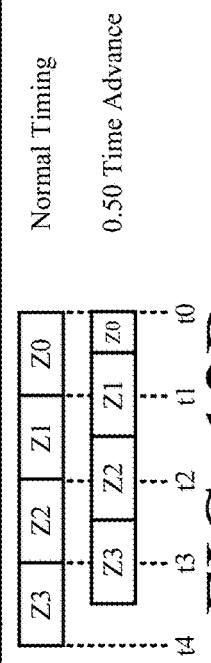

Normal Timing 0.50 Time Advance

FIG. 12B

Time Advance 0.75 of a Sample Duration For Sample Sequence X0-X4
Output Samples Z0, Z1, Z2, Z3 Come Faster

| Filter Bank | Output | Time Advance | Discard | Result |
|---|---|---|---|---|
| First Polyphase Filter Bank 802 | Y0 | | | |
| | Y4 | | ✓ | |
| | Y8 | | ✓ | |
| | Y12 | | ✓ | |
| Second Polyphase Filter Bank 804 | Y1 | | ✓ | |
| | Y5 | | ✓ | |
| | Y9 | | ✓ | |
| | Y13 | | ✓ | |
| Third Polyphase Filter Bank 806 | Y2 | | ✓ | |
| | Y6 | | ✓ | |
| | Y10 | | ✓ | |
| | Y14 | | ✓ | |
| Fourth Polyphase Filter Bank 808 | Y3 | ✓ | | $Z0 = X0*C3$ |
| | Y7 | | | $Z1 = X0*C7 + X1*C3$ |
| | Y11 | | | $Z2 = X0*C11 + X1*C7 + X2*C3$ |
| | Y15 | | | $Z3 = X0*C15 + X1*C11 + X2*C7 + X3*C3$ |

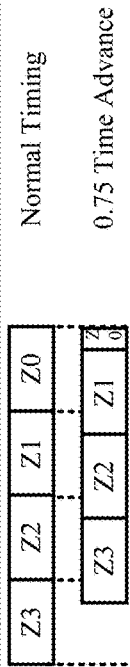

Normal Timing 0.75 Time Advance

FIG. 12C

Time Advance 1.0 Sample Duration For Sample Sequence X0-X4
Output Samples Z0, Z1, Z2, Z3 Come Faster

| Filter Bank | Output | Time Advance | Discard | Result |
|---|---|---|---|---|
| First Polyphase Filter Bank 802 | Y0 | | ✓ | Z0=X0*C0 |
| | Y4 | | | Z1=X0*C4+X1*C0 |
| | Y8 | | | Z2=X0*C8+X1*C4+X2*C0 |
| | Y12 | | | Z3=X0*C12+X1*C8+X2*C4+X3*C0 |
| Second Polyphase Filter Bank 804 | Y1 | ⟵ | ✓ | |
| | Y5 | | ✓ | |
| | Y9 | | ✓ | |
| | Y13 | | ✓ | |
| Third Polyphase Filter Bank 806 | Y2 | | ✓ | |
| | Y6 | | ✓ | |
| | Y10 | | ✓ | |
| | Y14 | | ✓ | |
| Fourth Polyphase Filter Bank 808 | Y3 | | ✓ | |
| | Y7 | | ✓ | |
| | Y11 | | ✓ | |
| | Y15 | | ✓ | |

Normal Timing 1.00 Time Advance

Time Retardation by 0.25 of a Sample Duration Between X1 and X2
Output Samples Z1, Z2, Z3 Come Slower

| Filter Bank | Output | Retard | Discard | Result |
|---|---|---|---|---|
| First Polyphase Filter Bank 802 | Y0 | | | Z0=X0*C0 |
| | Y4 | | ✓ | |
| | Y8 | | ✓ | |
| | Y12 | | ✓ | |
| Second Polyphase Filter Bank 804 | Y1 | ← | ✓ | |
| | Y5 | | | Z1=X0*C5+X1*C1 |
| | Y9 | | | |
| | Y13 | | | |
| Third Polyphase Filter Bank 806 | Y2 | ← | | Z2=X0*C9+X1*C5+X2*C1 |
| | Y6 | | | |
| | Y10 | | | |
| | Y14 | | | |
| Fourth Polyphase Filter Bank 808 | Y3 | | ✓ | Z3=X0*C13+X1*C9+X2*C5+X3*C1 |
| | Y7 | | ✓ | |
| | Y11 | | ✓ | |
| | Y15 | | ✓ | |

0.25 Longer Time Duration

Time Retardation by 0.50 of a Sample Duration Between X1 and X2
Output Samples Z1, Z2, Z3 Come Slower

| Filter Bank | Output | Retard | Discard | Result |
|---|---|---|---|---|
| First Polyphase Filter Bank 802 | Y0 | | | $Z0 = X0*C0$ |
| | Y4 | | ✓ | |
| | Y8 | | ✓ | |
| | Y12 | | ✓ | |
| Second Polyphase Filter Bank 804 | Y1 | | ✓ | |
| | Y5 | | ✓ | |
| | Y9 | | ✓ | |
| | Y13 | | ✓ | |
| Third Polyphase Filter Bank 806 | Y2 | ↘ | | $Z1 = X0*C6 + X1*C2$ |
| | Y6 | | | $Z2 = X0*C10 + X1*C6 + X2*C2$ |
| | Y10 | | | |
| | Y14 | | | |
| Fourth Polyphase Filter Bank 808 | Y3 | ↘ | ✓ | $Z3 = X0*C14 + X1*C10 + X2*C6 + X3*C2$ |
| | Y7 | | ✓ | |
| | Y11 | | ✓ | |
| | Y15 | | ✓ | |

0.50 Longer Time Duration

Time Retardation by 0.75 of a Sample Duration Between X1 and X2
Output Samples Z1, Z2, Z3 Come Slower

| Filter Bank | Output | Retard | Discard | Result |
|---|---|---|---|---|
| First Polyphase Filter Bank 802 | Y0 | → | | Z0=X0*C0 |
| | Y4 | | ✓ | |
| | Y8 | | ✓ | |
| | Y12 | | ✓ | |
| Second Polyphase Filter Bank 804 | Y1 | | ✓ | |
| | Y5 | | ✓ | |
| | Y9 | | ✓ | |
| | Y13 | | ✓ | |
| Third Polyphase Filter Bank 806 | Y2 | | ✓ | |
| | Y6 | | ✓ | |
| | Y10 | | ✓ | |
| | Y14 | | ✓ | |
| Fourth Polyphase Filter Bank 808 | Y3 | → | | Z1=X0*C7+X1*C3 |
| | Y7 | | | Z2=X0*C11+X1*C7+X2*C3 |
| | Y11 | | | Z3=X0*C12+X1*C8+X2*C4+X3*C0 |
| | Y15 | | | |

0.75 Longer Time Duration

| Coefficients | C0 | C1 | C2 | C3 | C4 | C5 | C6 | C7 | C8 | C9 | C10 | C11 | C12 | C13 | C14 | C15 | Result |
|---|---|---|---|---|---|---|---|---|---|---|---|---|---|---|---|---|---|
| First Polyphase Filter Bank 1702 | ✓ | | | | ✓ | | | | ✓ | | | | ✓ | | | | $Q0=Z0*C0$<br>$Q4=Z0*C4+Z1*C0$<br>$Q8=Z0*C8+Z1*C4+Z2*C0$<br>$Q12=Z0*C12+Z1*C8+Z2*C4+Z3*C0$ |
| Second Polyphase Filter Bank 1704 | | ✓ | | | | ✓ | | | | ✓ | | | | ✓ | | | $Q1=Z0*C1$<br>$Q5=Z0*C5+Z1*C1$<br>$Q9=Z0*C9+Z1*C5+Z2*C1$<br>$Q13=Z0*C13+Z1*C9+Z2*C5+Z3*C1$ |
| Third Polyphase Filter Bank 1706 | | | ✓ | | | | ✓ | | | | ✓ | | | | ✓ | | $Q2=Z0*C2$<br>$Q6=Z0*C6+Z1*C2$<br>$Q10=Z0*C10+Z1*C6+Z2*C2$<br>$Q14=Z0*C14+Z1*C10+Z2*C6+Z3*C2$ |
| Fourth Polyphase Filter Bank 1708 | | | | ✓ | | | | ✓ | | | | ✓ | | | | ✓ | $Q3=Z0*C3$<br>$Q7=Z0*C7+Z1*C3$<br>$Q11=Z0*C11+Z1*C7+Z2*C3$<br>$Q15=Z0*C15+Z1*C11+Z2*C47+Z3*C3$ |

Input Sample Sequence Z0-Z3

FIG. 18

Remove Time Advance Equal to 0.25 of a Sample Duration
With Input Sample Sequence Z0-Z3

| Filter Bank | Output | Retard | Discard | Result |
|---|---|---|---|---|
| First Polyphase Filter Bank 1702 | Q0 | | | $W0 = Z0*C1$ |
| | Q4 | | ✓ | |
| | Q8 | | ✓ | |
| | Q12 | | ✓ | |
| Second Polyphase Filter Bank 1704 | Q1 | ✓ | | |
| | Q5 | | ✓ | $W1 = Z0*C5 + Z1*C1$ |
| | Q9 | | | $W2 = Z0*C9 + Z1*C5 + Z2*C1$ |
| | Q13 | | | $W3 = Z0*C13 + Z1*C9 + Z2*C5 + Z3*C1$ |
| Third Polyphase Filter Bank 1706 | Q2 | ✓ | | |
| | Q6 | | ✓ | |
| | Q10 | | ✓ | |
| | Q14 | | ✓ | |
| Fourth Polyphase Filter Bank 1708 | Q3 | | ✓ | |
| | Q7 | | ✓ | |
| | Q11 | | ✓ | |
| Q15 | | ✓ | | |

Remove Time Advance Equal to 0.75 of a Sample Duration
With Input Sample Sequence Z0-Z3

| Filter Bank | Output | Time Retard | Discard | Result |
|---|---|---|---|---|
| First Polyphase Filter Bank 802 | Q0 | | | W0=Z0*C3 |
| | Q4 | | ✓ | |
| | Q8 | | ✓ | |
| | Q12 | | ✓ | |
| Second Polyphase Filter Bank 804 | Q1 | | ✓ | |
| | Q5 | | ✓ | |
| | Q9 | | ✓ | |
| | Q13 | | ✓ | |
| Third Polyphase Filter Bank 806 | Q2 | | ✓ | |
| | Q6 | | ✓ | |
| | Q10 | | ✓ | |
| | Q14 | | ✓ | |
| Fourth Polyphase Filter Bank 808 | Q3 | ↘ | | W1=Z0*C7+Z1*C3 |
| | Q7 | | | W2=Z0*C11+Z1*C7+Z2*C3 |
| | Q11 | | | W3=Z0*C15+X1*C11+X2*C7+X3*C3 |
| | Q15 | | | |

Remove Time Advance Equal to 1.0 Sample Duration
With Input Sample Sequence Z0-Z3

| Filter Bank | Output | Time Advance | Discard | Result |
|---|---|---|---|---|
| First Polyphase Filter Bank 802 | Q0 | ↘ | ✓ | W0=Z0*C0 |
| | Q4 | | | W1=Z0*C4+Z1*C0 |
| | Q8 | | | W2=Z0*C8+Z1*C4+Z2*C0 |
| | Q12 | | | W3=Z0*C12+Z1*C8+Z2*C4+Z3*C0 |
| Second Polyphase Filter Bank 804 | Q1 | | ✓ | |
| | Q5 | | ✓ | |
| | Q9 | | ✓ | |
| | Q13 | | ✓ | |
| Third Polyphase Filter Bank 806 | Q2 | | ✓ | |
| | Q6 | | ✓ | |
| | Q10 | | ✓ | |
| | Q14 | | ✓ | |
| Fourth Polyphase Filter Bank 808 | Q3 | | ✓ | |
| | Q7 | | ✓ | |
| | Q11 | | ✓ | |
| | Q15 | | ✓ | |

Remove Time Retardation Equal to 0.25 of a Sample Duration
With Input Sample Sequence Z0-Z3

| Filter Bank | Output | Time Advance | Discard | Result |
|---|---|---|---|---|
| First Polyphase Filter Bank 1702 | Q0 | | ✓ | |
| | Q4 | | ✓ | |
| | Q8 | | ✓ | |
| | Q12 | | ✓ | |
| Second Polyphase Filter Bank 1704 | Q1 | | | $W0=Z0*C1$ |
| | Q5 | | | $W1=Z0*C5+Z1*C1$ |
| | Q9 | | | $W2=Z0*C9+Z1*C5+Z2*C1$ |
| | Q13 | | | $W3=Z0*C13+Z1*C9+Z2*C5+Z3*C1$ |
| Third Polyphase Filter Bank 1706 | Q2 | | ✓ | |
| | Q6 | | ✓ | |
| | Q10 | | ✓ | |
| | Q14 | | ✓ | |
| Fourth Polyphase Filter Bank 1708 | Q3 | | ✓ | |
| | Q7 | ✓ | | |
| | Q11 | | ✓ | |
| | Q15 | | ✓ | |

Remove Time Retardation Equal to 0.50 of a Sample Duration
With Input Sample Sequence Z0-Z3

| Filter Bank | Output | Time Advance | Discard | Result |
|---|---|---|---|---|
| First Polyphase Filter Bank 1702 | Q0 | | ✓ | |
| | Q4 | | ✓ | |
| | Q8 | | ✓ | |
| | Q12 | | ✓ | |
| Second Polyphase Filter Bank 1704 | Q1 | | ✓ | |
| | Q5 | | ✓ | |
| | Q9 | | ✓ | |
| | Q13 | | ✓ | |
| Third Polyphase Filter Bank 1706 | Q2 | ✓ | | W0=Z0*C2 |
| | Q6 | | | W1=Z0*C6+Z1*C2 |
| | Q10 | | | W2=Z0*C10+Z1*C6+Z2*C2 |
| | Q14 | | | W3=Z0*C14+Z1*C10+Z2*C6+Z3*C2 |
| Fourth Polyphase Filter Bank 1708 | Q3 | | ✓ | |
| | Q7 | | ✓ | |
| | Q11 | | ✓ | |
| | Q15 | | ✓ | |

Remove Time Retardation Equal to 0.75 of a Sample Duration
With Input Sample Sequence Z0-Z3

| Filter Bank | Output | Time Advance | Discard | Result |
|---|---|---|---|---|
| First Polyphase Filter Bank 1702 | Q0 | | ✓ | |
| | Q4 | | ✓ | |
| | Q8 | | ✓ | |
| | Q12 | | ✓ | |
| Second Polyphase Filter Bank 1704 | Q1 | | ✓ | |
| | Q5 | | ✓ | |
| | Q9 | | ✓ | |
| | Q13 | | ✓ | |
| Third Polyphase Filter Bank 1706 | Q2 | | ✓ | |
| | Q6 | | ✓ | |
| | Q10 | | | |
| | Q14 | | | |
| Fourth Polyphase Filter Bank 1708 | Q3 | ✓ | | $W0 = Z0*C3$ |
| | Q7 | | | $W1 = Z0*C7 + Z1*C3$ |
| | Q11 | | | $W2 = Z0*C11 + Z1*C7 + Z2*C3$ |
| | Q15 | | | $W3 = Z0*C15 + Z1*C11 + Z2*C7 + Z3*C3$ |

SYSTEMS AND METHODS FOR CYCLOSTATIONARY FEATURE ELIMINATION

FIELD

This document relates generally to communication systems. More particularly, this document relates to implementing systems and methods for cyclostationary feature elimination.

BACKGROUND

There are many transmit modulation schemes known in the art. These transmit modulation schemes include M-ary Phase Shift Keying ("MPSK"), M-ary Quadrature Amplitude Modulation ("MQAM"), M-ary Frequency Shift Keying ("FSK"), Continuous Phase Modulation ("CPM"), and Orthogonal Frequency Division Multiplexing ("OFDM"). The listed transmit modulation schemes have inherent cyclostationary properties that can be used to detect the transmitted waveforms. A chip rate detector is often used to detect the transmitted waveforms.

SUMMARY

The present disclosure concerns implementing systems and methods for removing dither introduced into a transmitted RF signal. The methods comprise: receiving, by a receiver, the transmitted RF signal; and converting, by the receiver, the transmitted RF signal into a discrete-time IF signal comprising a sequence of samples. At least a first sample of the samples has a first sample duration different than a second sample duration of at least a second sample of said samples. A sub-sample dither removal device of the receiver performs operations to modify a sample timing of the discrete-time IF signal by decreasing or increasing the first sample duration of the first sample using a digital signal processing technique. The digital signal processing technique includes, but is not limited to, a polyphase resampling filter technique, a sample dropping/repeating technique, or a Farrow filter technique that adds or drops a plurality of samples from the discrete-time IF signal.

In some scenarios, a time advance equal to one sample duration is removed from the discrete-time IF signal at the sub-sample dither removal device by repeating a sample in a sequence of output samples. A time advance equal to an amount of a sample duration is removed from the discrete-time IF signal at the sub-sample dither removal device by introducing a time retardation equal to the amount of the sample duration into the discrete-time IF signal. A time retardation equal to an amount of a sample duration is removed from the discrete-time IF signal at the sub-sample dither removal device by introducing a time advancement equal to the amount of the sample duration into the discrete-time IF signal.

In those or other scenarios, the first sample duration of the first sample is longer than the second sample duration of the second sample. The first sample duration is decreased by a first incremental amount of a sample duration by outputting results only from a first select one of a plurality of polyphase filter banks from the sub-sample dither removal device. The results from all unselected ones of the poyphase filter banks are discarded or not computed. The duration of at least one third sample of the sequence is decreased by a second incremental amount of the sample duration by outputting results only from a second select one of the plurality of polyphase filter banks from the sub-sample dither removal device.

In those or other scenarios, the first sample duration of the first sample is shorter than the second sample duration of the second sample. The first sample duration is increased by a first incremental amount of a sample duration by outputting only one result from a first select one of a plurality of polyphase filter banks of the sub-sample dither removal device, immediately followed by at least one result from a second different select one of the plurality of polyphase filter banks. The duration of at least one third sample of the sequence is increased by a second incremental amount of the sample duration by outputting only one result from the first select one of a plurality of polyphase filter banks of the sub-sample dither removal device, immediately followed by at least one result from a third different select one of the plurality of polyphase filter banks.

DESCRIPTION OF THE DRAWINGS

The present solution will be described with reference to the following drawing figures, in which like numerals represent like items throughout the figures.

FIG. 9 is an illustration that is useful for understanding a conventional 4:1 interpolation with four input samples.

FIG. 10 is an illustration that is useful for understanding a conventional 1:1 interpolation: decimation process with four input samples.

FIGS. 12A-12D (collectively referred to as "FIG. 12") provide illustrations that are useful for understanding operations of the sub-sample dithering processing device shown in FIG. 6 for introducing a time advance in a sequence of samples.

FIG. 18 is an illustration that is useful for understanding the operations of the polyphase filter shown in FIG. 17.

DETAILED DESCRIPTION

Figure 1:
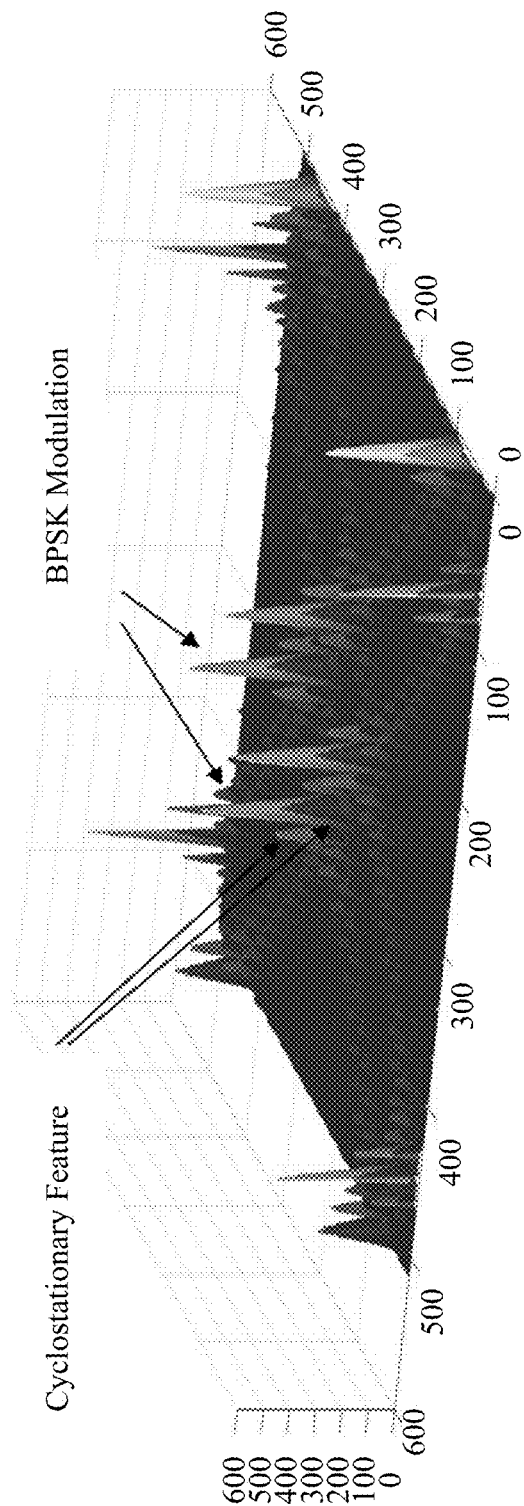
FIG. 1 is an illustrative graph showing the results of a conventional spectral correlation function.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Techniques are desired which can reduce the inherent cyclostationary properties of transmitted waveforms in order to reduce their probability of detection making them Low Probability of Detection ("LPD") and Low Probability of Intercept ("LPI") without affecting the demodulation performance of the waveforms. The present solution provides such a technique.

There are several conventional algorithms used in cyclo stationary feature detection. Detection of cyclo stationary features allows a receiving device to gain knowledge of when a transmitter (e.g., an UAV) is transmitting a signal (e.g., video). When such knowledge is gained, a nefarious party may locate the transmitter and destroy it. This is not desirable in many applications, especially military applications.

One such conventional method is a frequency domain method known as the Spectral Correlation Function ("SCF"). The SCF method uses a Fast Fourier Transform ("FFT") of the incoming signal and then auto-correlates the signal with itself for every combination of an FFT bin offset. FIG. 1 provides a graph showing illustrative results from performing the SCF method. The graph of FIG. 1 shows the frequency offset from zero. If BPSK modulation is employed without any frequency offset from bin zero, then there would be only one BPSK modulation tone in the center of the graph. But, because a slight frequency offset is employed, four BPSK modulation tones appear in the center of the array. One dimension represents an FFT size (e.g., 4096), and a second dimension represents the frequency offset. The cyclostationary features are the smaller tones on the sides of each BPSK modulation tone.

Figure 2:
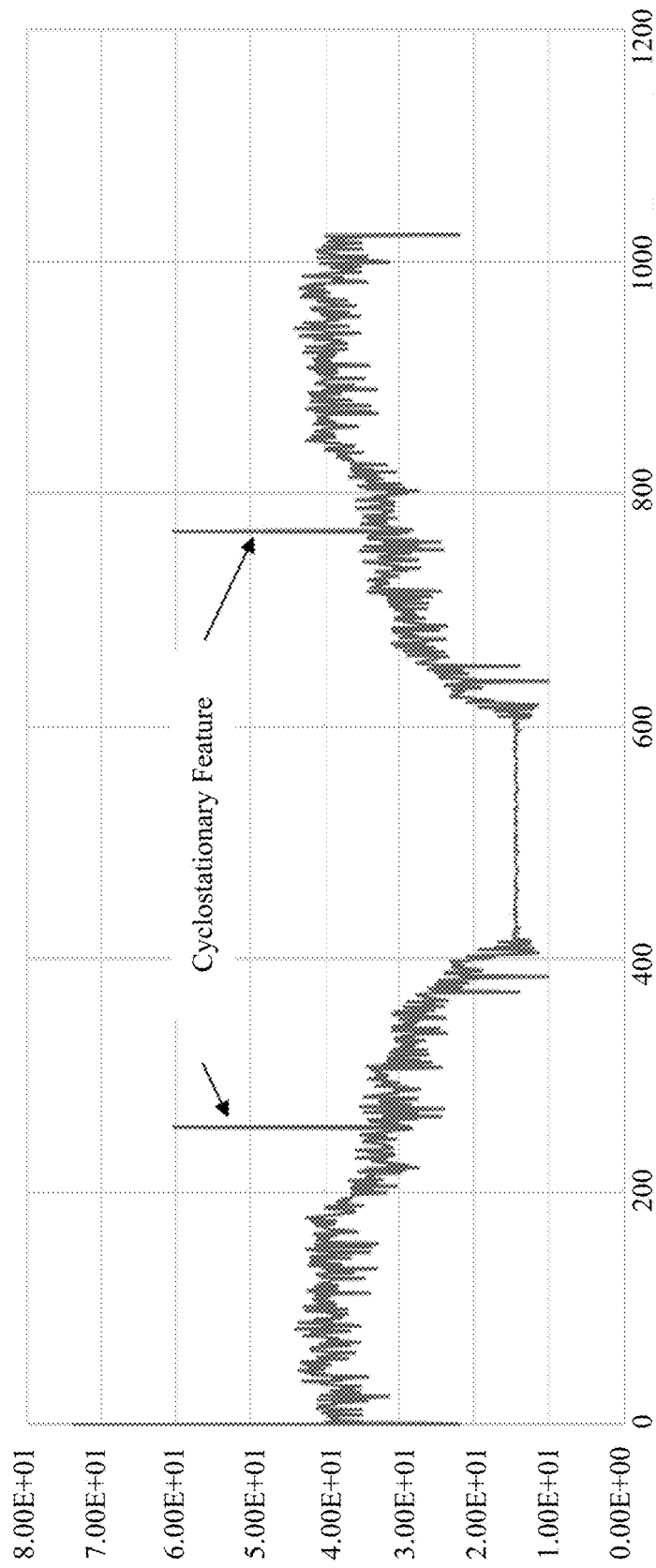
FIG. 2 is an illustrative graph showing the results of a chip rate detector.

Another such method is a time domain detection method employed by chip rate detectors. For this analysis, the FFT of the result illustrates the position of the cyclo stationary features. At the output of the FFT, cyclo stationary features exist in bins. The bins are exactly in the position of the symbol rate. Second-order time domain cyclo stationary properties are computed as the input signal squared or input signal times the conjugate of itself $x^*x$ or $x^*x^*$ to obtain power values. Fourth-order time domain cyclo stationary properties are computed as $x^*x^*x^*x$ or $x^*x^{**}x^*x^*$. The output of a chip rate detector implementing a fourth-order time domain algorithm is shown in FIG. 2. Two cyclostationary features exists in FIG. 2.

Varying the symbol rate can reduce or eliminate the cyclostationary features. The term "symbol rate" or "baud rate", as used herein, refer to the number of symbols per second measured in baud (Bd). The plots shown in FIGS. 1-2 require a lot of averaging over long periods of time for the cyclostationary features to appear. Varying the symbol rate in these conventional techniques degrades the averaging to the point of inhibiting detection.

Figure 22:
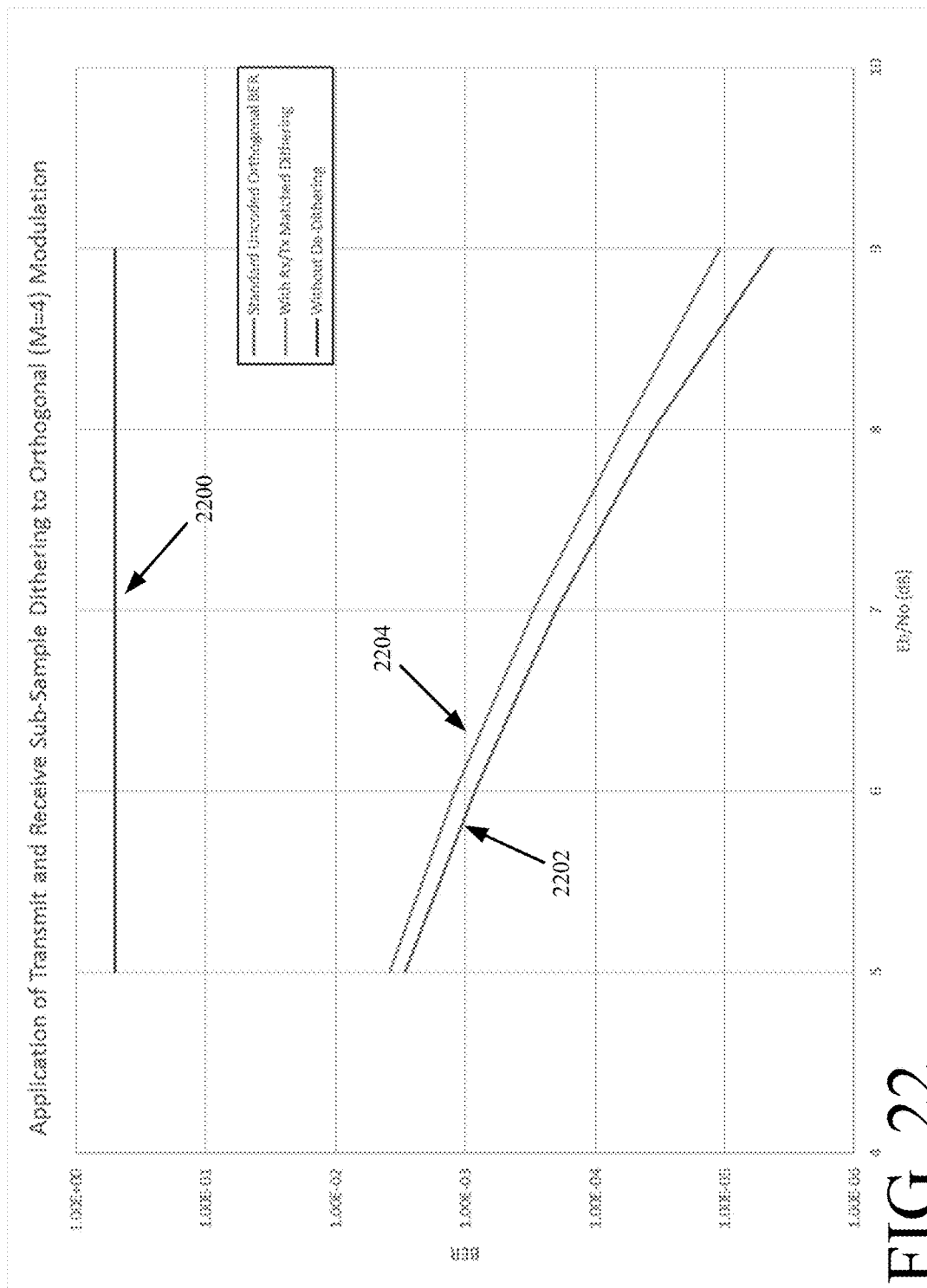
FIG. 22 is a graph showing an improved performance of a communications system implementing the present solution as compared to that of conventional communications systems.

In the present solution, the symbol rate is varied throughout a single burst transmission using polyphase resampling filter operations to modify the symbol timing. This technique provides a communications device with a small degradation in Bit Error Rate ("BER") performance, as displayed in FIG. 22. FIG. 22 shows that there is only a 0.25 dB degradation of the BER in a communications system implementing the present solution.

Figure 3:
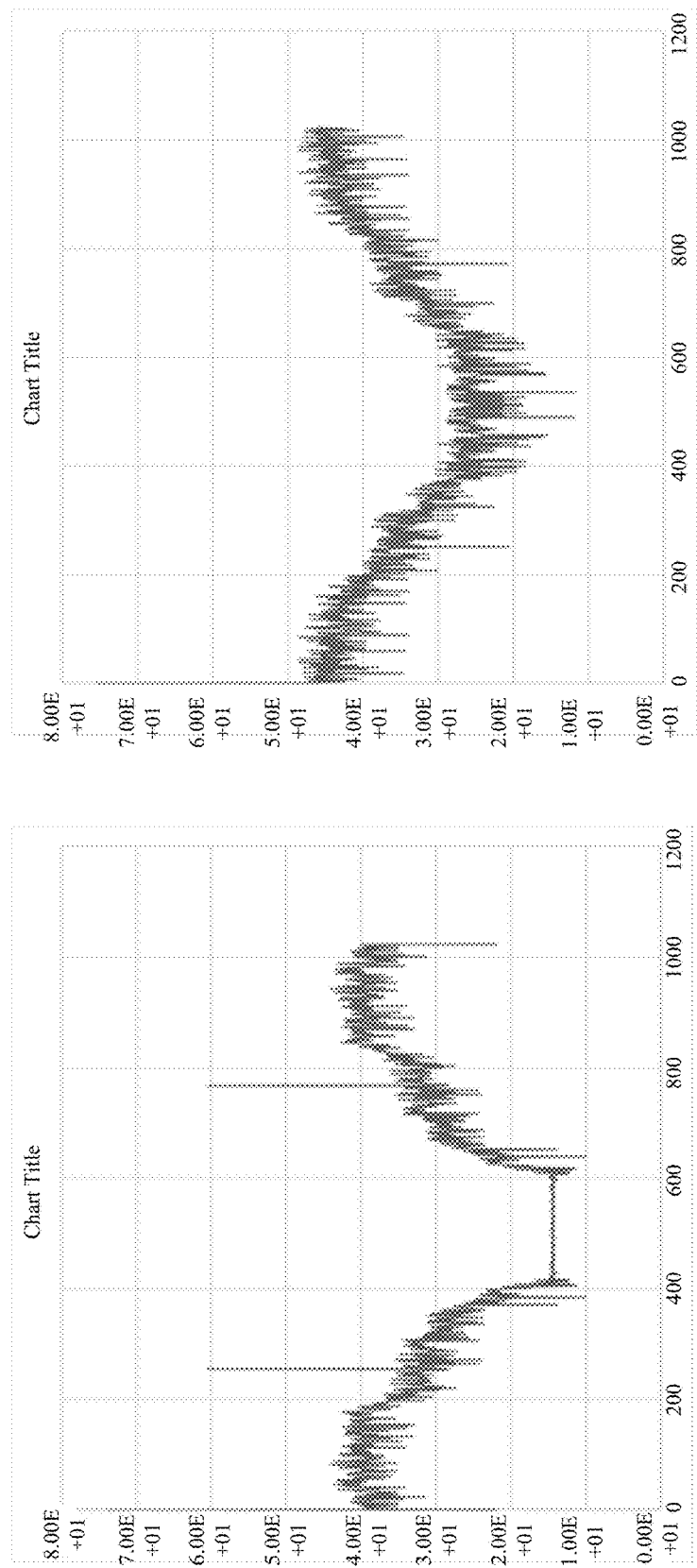
FIG. 3 provides illustrative graphs showing a waveform before and after application of sub-sample dithering in accordance with the present solution.

A polyphase resampling filter operations provide a computational optimization of a standard interpolate-filter-decimate algorithm. With interpolation, zero's are added to the incoming digital stream of samples. Rather than perform (wasted) multiplication of zero's times the signal, a reduced set of coefficients are created (in a single 'bank' of coefficients) to be multiplied by the non-zero samples. In a set of polyphase resample coefficient banks, each combination of coefficients is available. By selecting a change in a filter bank, the system advances or retards the signal timing via sample duration modifications. FIG. 3 shows the waveform before and after application of sub-sample dithering in accordance with the present solution.

Conventional analog methods utilize sample-and-hold circuits which require higher overall sample rates at both the receiver and the transmitter. The present solution allows radios to process samples at the modulation chip rate while adding sub-sample dithering, thus reducing power and complexity of the radio system. The sample processing involves performing operations by a sub-sample dithering processing device of the transmitter to modify a sample timing of the discrete-time IF signal by decreasing or increasing a duration of at least one first sample of the sequence using a digital signal processing technique in the digital domain. The digital signal processing technique includes, but is not limited to, a polyphase resampling filter technique, a sample dropping/repeating technique, or a Farrow filter technique. Polyphase resampling filters, sample dropping/repeating element, and Farrow filters are known in the art. However, such filters and elements are conventionally used at the receiver side, and not at the transmitter side as is done in the present solution. The sample dropping/repeating technique and Farrow filter technique are more complex and less efficient as compared to the polyphase filter implementations. As such, the present solution will be described herein in relation to the polyphase filter implementations. However, the present solution is not limited in this regard.

Illustrative Communications Architecture

Figure 4:
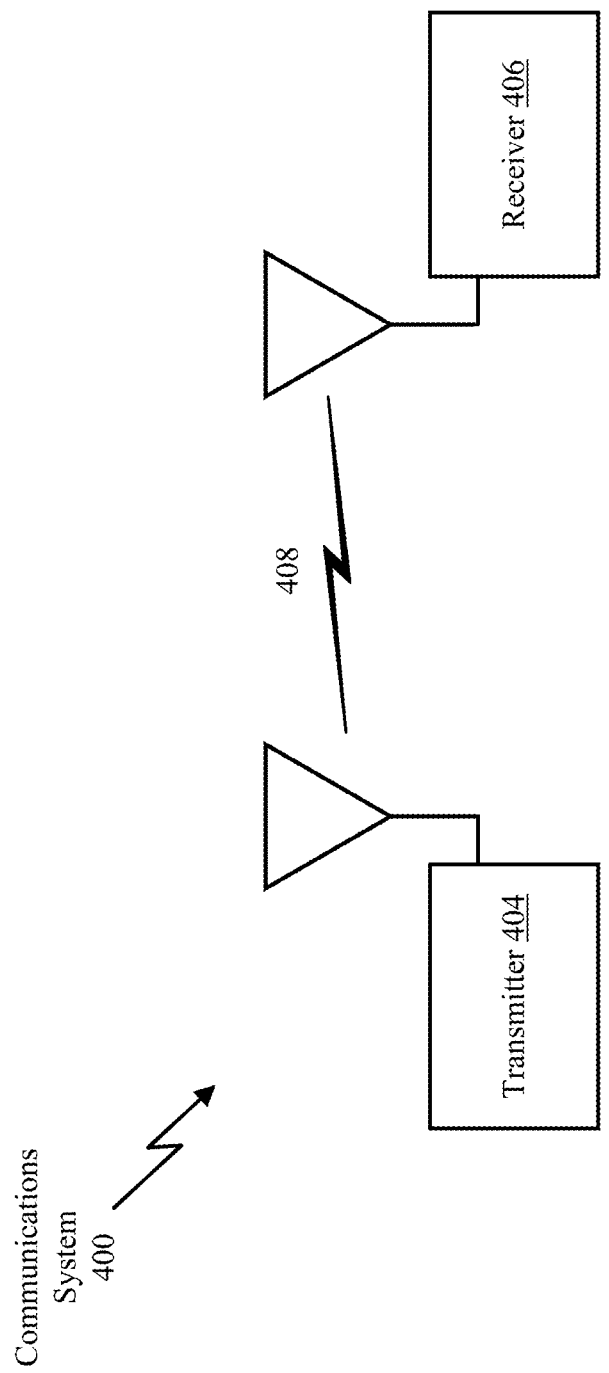
FIG. 4 is an illustration of an illustrative communications system implementing the present solution.

Referring now to FIG. 4, there is provided an illustration of an illustrative communications system 400. Communications system 400 is generally configured to allow communications amongst a plurality of radios 402 with a low probability of detection. In this regard, the communications system 400 comprises a transmitter 404 and a receiver 406. Transmitter 404 is configured to generate a discrete-time IF signal, convert the discrete-time IF signal into an analog signal, and communicate the analog signal to the receiver 406 over a communications link 408. Prior to being transmitted, the sample timing of the discrete-time IF signal is modified in accordance with a novel sub-sample dithering scheme, which is described in detail below. At the receiver 406, an inverse of the sub-sample dithering scheme is performed to recover the original discrete-time IF signal.

Figure 5:
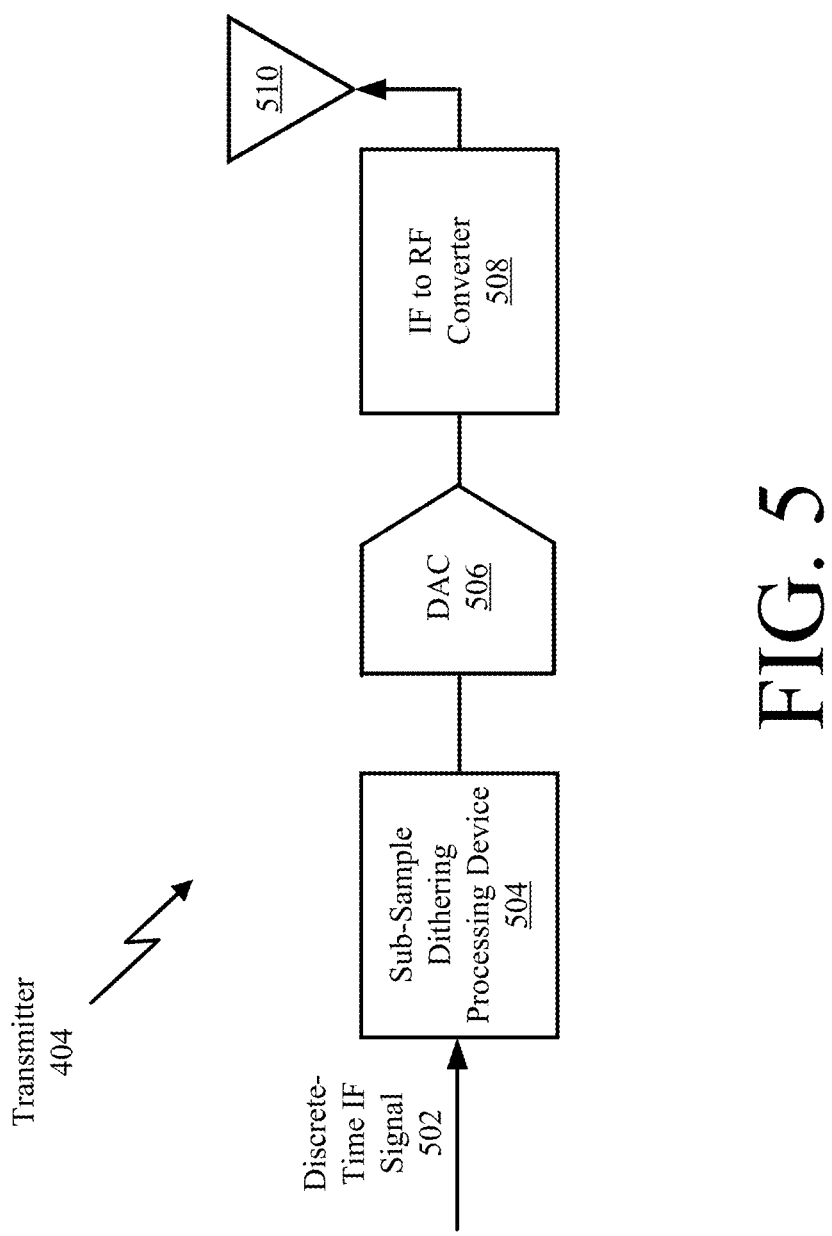
FIG. 5 is an illustration of an illustrative architecture for the transmitter of FIG. 4.

Referring now to FIG. 5, there is provided a more detailed block diagram of the transmitter 404. Transmitter 404 has been selected to illustrate the introduction of symbol timing modifications into the transmit side. In this regard, it should be understood that the transmitter 404 comprises a sub-sample dithering processing device 504, a Digital-to-Analog Converter ("DAC") 506, an IF to RF converter 508, and an antenna 510.

Figure 6:
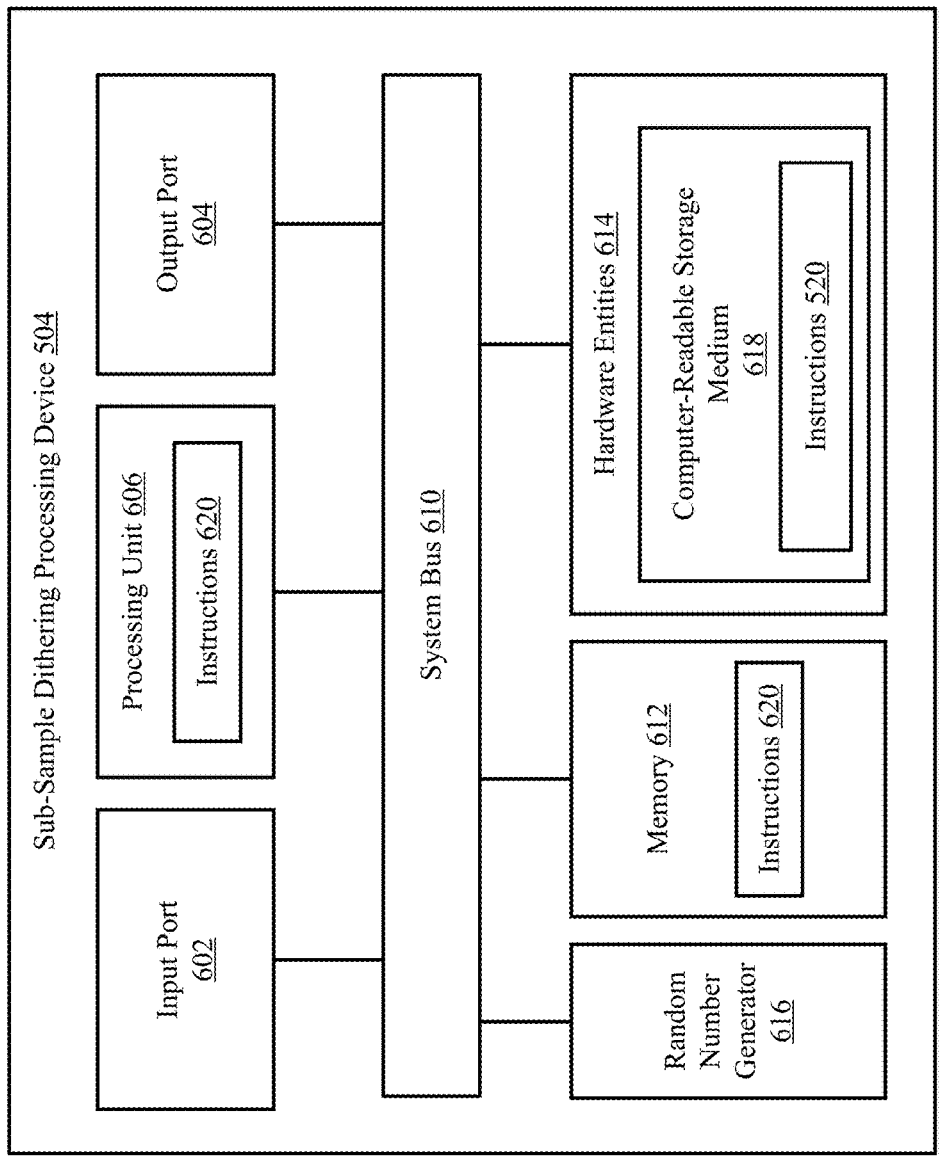
FIG. 6 is an illustration of an illustrative architecture for the sub-sample dithering processing device shown in FIG. 5.

The sub-sample dithering processing device 504 is configured to receive a discrete-time IF signal 502 (i.e., a sequence of samples), process the same to selectively introduce time advances and/or delays in a sequence of samples, and provide the sequence of samples with the time advances and/or time delays to the DAC 506. An illustrative architecture of the sub-sample dithering processing device 504 is provided in FIG. 6. FIG. 6 will be discussed below.

The DAC 506 is configured to receive the sequence of samples from device 504, convert the same into an analog signal, and communicate the analog signal to the IF to RF converter 508. DACs are well known in the art, and therefore will not be described herein. Any known or to be known DAC can be used herein without limitation.

IF to RF converter 508 is configured to translate in frequency a relatively low-frequency IF signal up to a transmitted RF signal. Apparatus and methods for performing IF to RF conversions are well known to persons having ordinary skill in the art of RF transmitter design, and therefore will not be described herein. IF to RF converter 508 is configured to communicate RF signals to antenna 510 for broadcast to a desired receiver.

Referring now to FIG. 6, there is provided a detailed block diagram of an illustrative architecture for the sub-sample dithering processing device 504. Device 504 may include more or less components than those shown in FIG. 6. However, the components shown are sufficient to disclose an illustrative embodiment implementing the present solution. The hardware architecture of FIG. 6 represents one embodiment of a representative sub-sample dithering processing device configured to facilitate cyclo stationary feature elimination. As such, the device 504 of FIG. 5 implements at least a portion of a method for selectively introducing time advances and/or delays in a sequence of samples in accordance with the present solution.

Some or all components of the device 504 can be implemented as hardware, software and/or a combination of hardware and software. The hardware includes, but is not limited to, one or more electronic circuits. The electronic circuits can include, but are not limited to, passive components (e.g., resistors and capacitors) and/or active components (e.g., amplifiers and/or microprocessors). The passive and/or active components can be adapted to, arranged to and/or programmed to perform one or more of the methodologies, procedures, or functions described herein.

As shown in FIG. 6, the device 504 comprises an input port 602, a processing unit 606, an output port 604, a system bus 610, a random number generator 616, a memory 612 connected to and accessible by other portions of device 504 through system bus 610, and hardware entities 614 connected to system bus 610.

At least some of the hardware entities 614 perform actions involving access to and use of memory 612. Hardware entities 614 can include a computer-readable storage medium 618 on which is stored one or more sets of instructions 620 (e.g., software code) configured to implement one or more of the methodologies, procedures, or functions described herein. The instructions 620 can also reside, completely or at least partially, within the memory 612 and/or within the processing unit 606 during execution thereof by the device 504. The memory 612 and the processing unit 606 also can constitute machine-readable media. The term "machine-readable media", as used here, refers to a single medium or multiple media that store the one or more sets of instructions 620. The term "machine-readable media", as used here, also refers to any medium that is capable of storing, encoding or carrying a set of instructions 620 for execution by the device 504 and that cause the device 504 to perform any one or more of the methodologies of the present disclosure.

Figure 7:
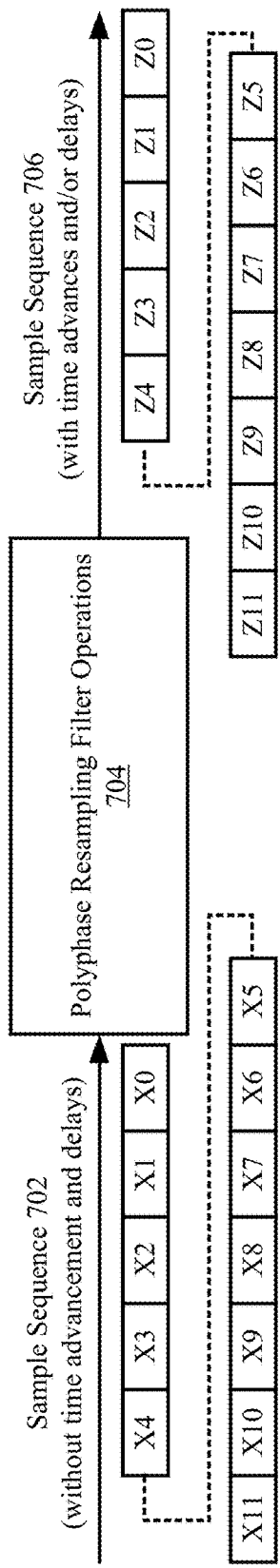
FIG. 7 is an illustration that is useful for understanding polyphase resampling filter operations performed by the sub-sample dithering processing device shown in FIG. 6.
Figure 8:
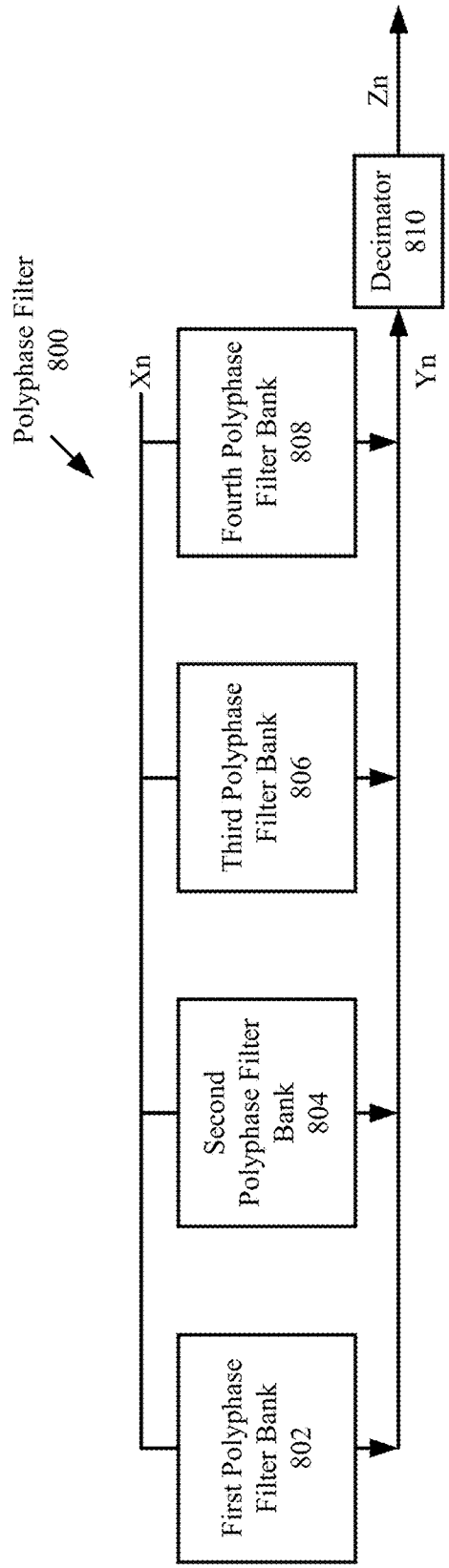
FIG. 8 is an illustration of an illustrative architecture for a polyphase filter.

Referring now to FIGS. 7-8, there are provided illustrations that are useful for understanding the operations performed by the sub-sample dithering processing device 504. The operations include polyphase resampling filter operations 704 for selectively introducing time advances or time retardations (or delays) in a sequence of samples X0, X1, X2, . . . , X11. The output of the polyphase resampling filter operations 704 is referred to herein as a sequence of samples Z0, Z1, Z2, . . . , Z11. Notably, the polyphase resampling filter operations 704 outputs the same number of samples as it receives, i.e., there is a 1 to 1 correspondence between input samples and output samples. Although the sequence of samples is shown in FIG. 7 as comprising twelve samples, the present solution is not limited in this regard. The sequence of samples can comprise any number of samples in accordance with a given application. Also, the sequence of samples X0, X1, X2, . . . , X11 can be an entire sequence of samples or any part of a larger sequence of samples.

The duration of each time advance and/or time delay may be randomly selected using the random number generator 616 of FIG. 6 and a plurality of polyphase filter banks 802, 804, 806, 808. In some scenarios, 128 polyphase filter banks are provided, each with 12 coefficients, so that time advances and delays which are multiples of 1/128 of a sample duration can be chosen. The present solution is not limited in this regard.

Polyphase filter banks are well known in the art, and therefore will not be described herein in detail. Still, a brief discussion of how polyphase filter banks have conventionally been used is now provided to assist in understanding the novel way in which polyphase filter banks are being used in the present solution.

Referring now to FIG. 9, there is provided an illustration that is useful for understanding operations of a polyphase filter in a 4:1 interpolation application. The polyphase filter is defined by the following Mathematical Equation.

$$Y_n = \sum_{k=0}^{k=16} C_k X_{n-k}$$

where $Y_n$ represents the output of the polyphase filter, $C_k$ represents a polyphase filter coefficient and $X_{n-k}$ represents an input sample. The polyphase filter is designed to output four samples for every one sample input thereto. In this regard, the polyphase filter comprises four polyphase filter banks 902, 904, 906, 908. Each filter banks has four coefficients assigned thereto. More specifically, a first polyphase filter bank 902 has coefficients C0, C4, C8 and C12 assigned thereto. A second polyphase filter bank 904 has coefficients C1, C5, C9 and C13 assigned thereto. A third polyphase filter bank 906 has coefficients C2, C6, C10 and C14 assigned thereto. A fourth polyphase filter bank 908 has coefficients C3, C7, C11 and C15 assigned thereto.

Operation of this polyphase filter will be explained below in relation to a scenario in which there are only four input samples and the $X_{n-k}$ values are all initialized to zero values in the filter memory (not shown). This scenario is selected for ease and simplicity of discussion.

During operation, four input samples X0, X1, X2 and X3 are input into the polyphase filter, and sixteen samples Y0, Y1, Y2, . . . , Y15 are output from the polyphase filter. Operations of the first polyphase filter bank 902 are defined by the following Mathematical Equations (1)-(4).

$$Y0=X0*C0 \quad (1)$$

$$Y1=X0*C4+X1*C0 \quad (2)$$

$$Y2=X0*C8+X1*C4+X2*C0 \quad (3)$$

$$Y3=X0*C12+X1*C8+X2*C4+X3*C0 \quad (4)$$

Operations of the second polyphase filter bank 904 are defined by the following Mathematical Equations (5)-(8).

$$Y1=X0*C1 \quad (5)$$

$$Y5=X0*C5+X1*C1 \quad (6)$$

$$Y9=X0*C9+X1*C5+X2*C1 \quad (7)$$

$$Y13=X0*C13+X1*C9+X2*C5+X3*C1 \quad (8)$$

Operations of the third polyphase filter bank 906 are defined by the following Mathematical Equations (9)-(12).

$$Y2=X0*C2 \quad (9)$$

$$Y6=X0*C6+X1*C2 \quad (10)$$

$$Y10=X0*C10+X1*C6+X2*C2 \quad (11)$$

$$Y14=X0*C14+X1*C10+X2*C6+X3*C2 \quad (12)$$

Operations of the second polyphase filter bank 908 are defined by the following Mathematical Equations (13)-(16).

$$Y2=X0*C3 \quad (13)$$

$$Y6=X0*C7+X1*C3 \quad (14)$$

$$Y10=X0*C11+X1*C7+X2*C3 \quad (15)$$

$$Y14=X0*C15+X1*C11+X2*C7+X3*C3 \quad (16)$$

As evident from Mathematical Equations (1)-(16), for four input values X0, X1, X2 and X3, sixteen values are output Y0, Y2, . . . , Y15.

Referring now to FIG. 10, there is provided an illustration that is useful for understanding how the 4:1 interpolator of FIG. 9 is transformed into a 1:1 interpolator with decimation. Similar to FIG. 9, the operations of this 1:1 interpolator with decimation will be explained below in relation to a scenario in which there are only four input samples and the $X_{n-k}$ values are all initialized to zero values in the filter memory (not shown). This scenario is selected for ease and simplicity of discussion.

When decimation is employed, output samples are selectively discarded so that for every one sample in, there is only one sample out. For example, if samples X0-X4 are input into the polyphase filter, then samples Y0, Y4, Y8, Y12 are output from the polyphase filter since Y0 is where X0 first appears, Y4 is where X1 first appears, Y8 is where X3 first appears and Y12 is where X4 first appears. With an optimized polyphase resampler, the samples which are to be discarded are not calculated.

Figure 11:
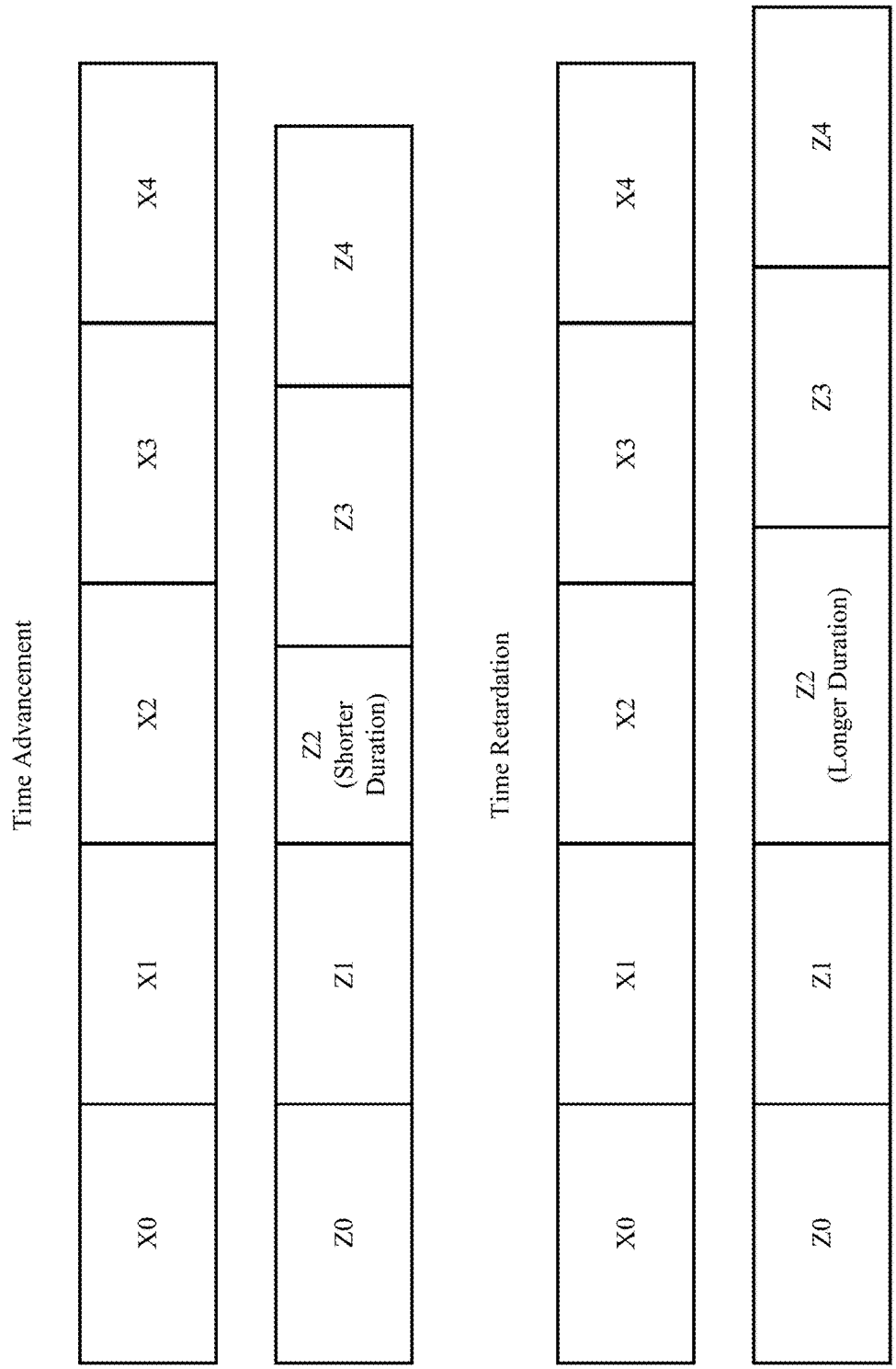
FIG. 11 is an illustration showing an illustrative time advancement in a sequence of samples and a time retardation in a sequence of samples.

Referring now to FIG. 11, there is provided an illustration that is useful for understanding how the polyphase filter is used in accordance with the present solution. As noted above, the present solution is designed to introduce time advancements in a sequence of sample and/or time retardations in a sequence of samples using a polyphase filter. A time advancement results in an output sample (e.g., output sample Z2) having a relatively shorter duration. In contrast, a time retardation results in an output sample (e.g., output sample Z2) having a relatively longer duration. The manner in which time advancements and time retardations are achieved will now be discussed in relation to FIG. 12 and FIG. 13.

Referring now to FIG. 12, time advancements will be discussed in relation to a scenario where: (1) four polyphase filter banks 802-808 are employed, each with four coefficients assigned thereto; and (2) there are only four input samples and the $X_{n-k}$ values are all initialized to zero values in the filter memory (not shown). In this scenario, a first polyphase filter bank 802 is configured to compute four outputs Y0, Y4, Y8, Y12 when a sample sequence X0-X4 is input thereto. A second polyphase filter bank 804 is configured to compute four outputs Y1, Y5, Y9, Y13 when a sample sequence X0-X4 is input thereto. A third polyphase filter bank 806 is configured to compute four outputs Y2, Y6, Y10, Y14 when a sample sequence X0-X4 is input thereto. A fourth polyphase filter bank 806 is configured to compute four outputs Y3, Y7, Y11, Y15 when a sample sequence X0-X4 is input thereto. In order to make a time advancement having a value less than a sample duration, output samples for all but one polyphase filter bank are discarded (e.g., via decimator 810 of FIG. 8). In order to introduce a time delay having a value equal to a sample duration, a sample is dropped from the output sequence (e.g., drop Z0 from the output sequence Z0-Z4).

Figure 12A:
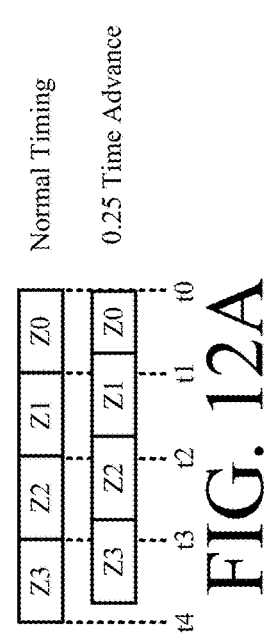

As shown in FIG. 12A, a relative time advance equal to a quarter (0.25) of a sample duration is achieved by selecting the outputs of the second polyphase filter bank 804, and discarding the outputs of the other polyphase filter banks 802, 806, 808. In this case, the output of the polyphase resampling filter operations 704 of FIG. 7 comprises Z0-Z3 defined by the following Mathematical Equations (17)-(20).

$$Z0=X0*C1 \tag{17}$$

$$Z1=X0*C5+X1*C1 \tag{18}$$

$$Z2=X0*C9+X1*C5+X2*C1 \tag{19}$$

$$Z3=X0*C13+X1*C9+X2*C5+X3*C1 \tag{20}$$

The first output sample Z0 has a sample duration that is 0.25 of a sample duration shorter than the other output samples Z1-Z3. In effect, samples Z1-Z3 appear earlier in the transmit sequence of samples.

As shown in FIG. 12B, a relative time advance equal to a half (0.50) of a sample duration is achieved by selecting the outputs of the third polyphase filter bank 806, and discarding the outputs of the other polyphase filter banks 802, 804, 808. In this case, the output of the polyphase resampling filter operations 704 of FIG. 7 comprises Z0-Z3 defined by the following Mathematical Equations (21)-(24).

$$Z0=X0*C2 \tag{21}$$

$$Z1=X0*C6+X1*C2 \tag{22}$$

$$Z2=X0*C10+X1*C6+X2*C2 \tag{23}$$

$$Z3=X0*C14+X1*C10+X2*C6+X3*C2 \tag{24}$$

The first output sample Z0 has a sample duration that is 0.50 of a sample duration shorter than the other output samples Z1-Z3. In effect, samples Z1-Z3 appear earlier in the transmit sequence of samples.

As shown in FIG. 12C, a relative time advance equal to three quarters (0.75) of a sample duration is achieved by selecting the outputs of the fourth polyphase filter bank 808, and discarding the outputs of the other polyphase filter banks 802, 804, 806. In this case, the output of the polyphase resampling filter operations 704 of FIG. 7 comprises Z0-Z3 defined by the following Mathematical Equations (25)-(28).

$$Z0=X0*C3 \tag{25}$$

$$Z1=X0*C7+X1*C3 \tag{26}$$

$$Z2=X0*C11+X1*C7+X2*C3 \tag{27}$$

$$Z3=X0*C15+X1*C11+X2*C7+X3*C3 \tag{28}$$

The first output sample Z0 has a sample duration that is 0.75 of a sample duration shorter than the other output samples Z1-Z3. In effect, samples Z1-Z3 appear earlier in the transmit sequence of samples.

Figure 12D:
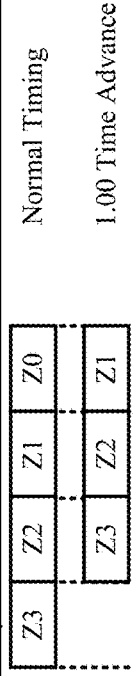

As shown in FIG. 12D, a relative time advance equal to one (1.00) sample duration is achieved by selecting the outputs of the first polyphase filter bank 802, and discarding (A) the outputs of the other polyphase filter banks 804, 806, 808 and (B) the first output of the first polyphase filter bank 802. In this case, the output of the polyphase resampling filter operations 704 of FIG. 7 comprises Z1-Z3 defined by the following Mathematical Equations (29)-(30).

$$Z1=X0*C4+X1*C0 \tag{29}$$

$$Z2=X0*C8+X1*C4+X2*C0 \tag{20}$$

$$Z3=X0*C12+X1*C8+X2*C4+X3*C0 \tag{30}$$

In effect, samples Z1-Z3 appear earlier in the transmit sequence by a full sample duration.

Referring now to FIG. 13, time retardations will be discussed in relation to a scenario where: (1) four polyphase filter banks 802-808 are employed, each with four coefficients assigned thereto; and (2) there are only four input samples and the $X_{n-k}$ values are all initialized to zero values in the filter memory (not shown).

Figure 13A:
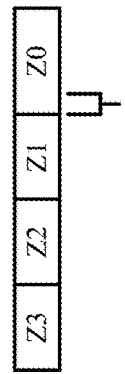
FIGS. 13A-13C (collectively referred to as "FIG. 13") provide illustrations that are useful for understanding operations of the sub-sample dithering processing device shown in FIG. 6 for introducing a time retard or delay in a sequence of samples.

As shown in FIG. 13A, a relative time retardation equal to a quarter (0.25) of a sample duration is achieved by selecting the outputs of the first and second polyphase filter banks 802, 804, and discarding (A) the outputs of the other polyphase filter banks 806, 808, (B) the second, third and fourth outputs of the first polyphase filter bank 802, and (C) the first output of the second polyphase filter banks 804. In this case, the output of the polyphase resampling filter operations 704 of FIG. 7 comprises Z0-Z3 defined by the following Mathematical Equations (31)-(34).

$$Z0=X0*C0 \tag{31}$$

$$Z1=X0*C5+X1*C1 \tag{32}$$

$$Z2=X0*C9+X1*C5+X2*C1 \tag{33}$$

$$Z3=X0*C13+X1*C9+X2*C5+X3*C1 \tag{34}$$

The first output sample Z0 has a 0.25 longer sample duration than that of the other output samples Z1-Z3. In effect, samples Z1-Z3 appear later in the transmit sequence of samples.

Figure 13B:
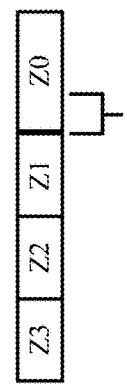

As shown in FIG. 13B, a relative time retardation equal to a half (0.50) of a sample duration is achieved by selecting the outputs of the first and third polyphase filter banks 802, 806, and discarding (A) the outputs of the other polyphase filter banks 804, 808, (B) the second, third and fourth outputs of the first polyphase filter bank 802, and (C) the first output of the third polyphase filter banks 806. In this case, the output of the polyphase resampling filter operations 704 of FIG. 7 comprises Z0-Z3 defined by the following Mathematical Equations (35)-(38).

$$Z0=X0*C0 \tag{35}$$

$$Z1=X0*C6+X1*C2 \tag{36}$$

$$Z2=X0*C10+X1*C6+X2*C2 \tag{37}$$

$$Z3=X0*C14+X1*C10+X2*C6+X3*C2 \tag{38}$$

The first output sample Z0 has a 0.50 longer sample duration than that of the other output samples Z1-Z3. In effect, samples Z1-Z3 appear later in the transmit sequence of samples.

Figure 13C:
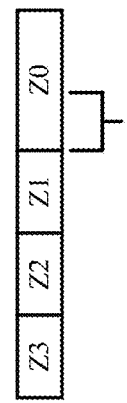

As shown in FIG. 13C, a relative time retardation equal to three quarters (0.75) of a sample duration is achieved by selecting the outputs of the first and fourth polyphase filter banks 802, 808, and discarding (A) the outputs of the other polyphase filter banks 804, 806, (B) the second, third and fourth outputs of the first polyphase filter bank 802, and (C) the first output of the fourth polyphase filter banks 808. In this case, the output of the polyphase resampling filter operations 704 of FIG. 7 comprises Z0-Z3 defined by the following Mathematical Equations (39)-(42).

$$Z0 = X0*C0 \tag{39}$$

$$Z1 = X0*C7 + X1*C3 \tag{40}$$

$$Z2 = X0*C11 + X1*C7 + X2*C3 \tag{41}$$

$$Z3 = X0*C15 + X1*C11 + X2*C7 + X3*C3 \tag{42}$$

The first output sample Z0 has a 0.75 longer sample duration than that of the other output samples Z1-Z3. In effect, samples Z1-Z3 appear later in the transmit sequence of samples.

In most applications of the present solution, the input sequence comprises N samples X0, X1, ..., XN, where N is any integer greater than zero. One or more time advancements and/or time retardations can be added to the sequence of samples via the polyphase resampling filter operations 704. The value of each time advancement/retardation can be randomly selected. In the case that more than one time advancement or retardation is made, the values thereof can be selected so that they are different throughout the entire sequence of samples (e.g., 128 samples) or only in a portion of the sequence of samples (e.g., 64 samples). Also, the number of samples S between time advancements and/or retardations can be the same or different. In the case where the number of samples between time advancements and/or retardations is different, S has a variable value which may be randomly selected. Further, the above-described process can be optimized by selectively computing only those values which are to be output as samples Z0-ZN (i.e., no discarding operations are performed). The result from performing the present solution is an elimination or reduction of cyclostationary features in a transmitted waveform.

Figure 14:
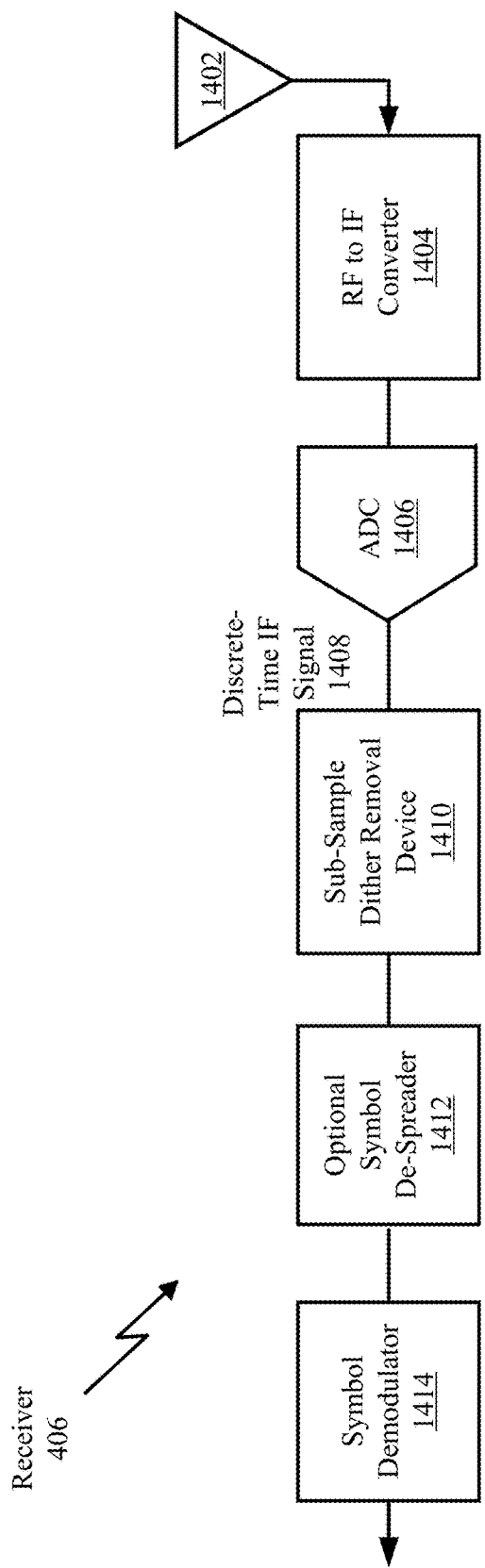
FIG. 14 is an illustration of an illustrative architecture for the receiver of FIG. 4.

Referring now to FIG. 14, there is provided a more detailed block diagram of the receiver 406 shown in FIG. 4. Receiver 406 illustrates the removal of time advancements and/or time retardations from the receive side and the recovery of the transmitted signal. As such, receiver 406 is comprised of an antenna 1402, an RF-to-IF converter 1404, an Analog-to-Digital Converter ("ADC") 1406, a sub-sample dither removal device 1410, an optional symbol de-spreader 1412, and a symbol demodulator 1414.

Antenna 1402 is configured to receive signals transmitted from transmitter 404. Antenna 1402 is also configured to communicate received signals to RF-to-IF converter 1404. RF-to-IF converter 1404 is configured to translate in frequency a relatively high-frequency RF signal to a different frequency IF signal. Apparatus and methods for performing RF-to-IF conversions are well known in the art, and therefore will not be described herein. Any known or to be known apparatus or method for performing RF-to-IF conversions can be used herein.

The output of the RF-to-IF converter 1404 is passed to the input of the ADC 1406. ADC 1406 is configured to convert analog voltage values to digital values, and communicate the digital values to the sub-sample dither removal device 1410.

Figure 15:
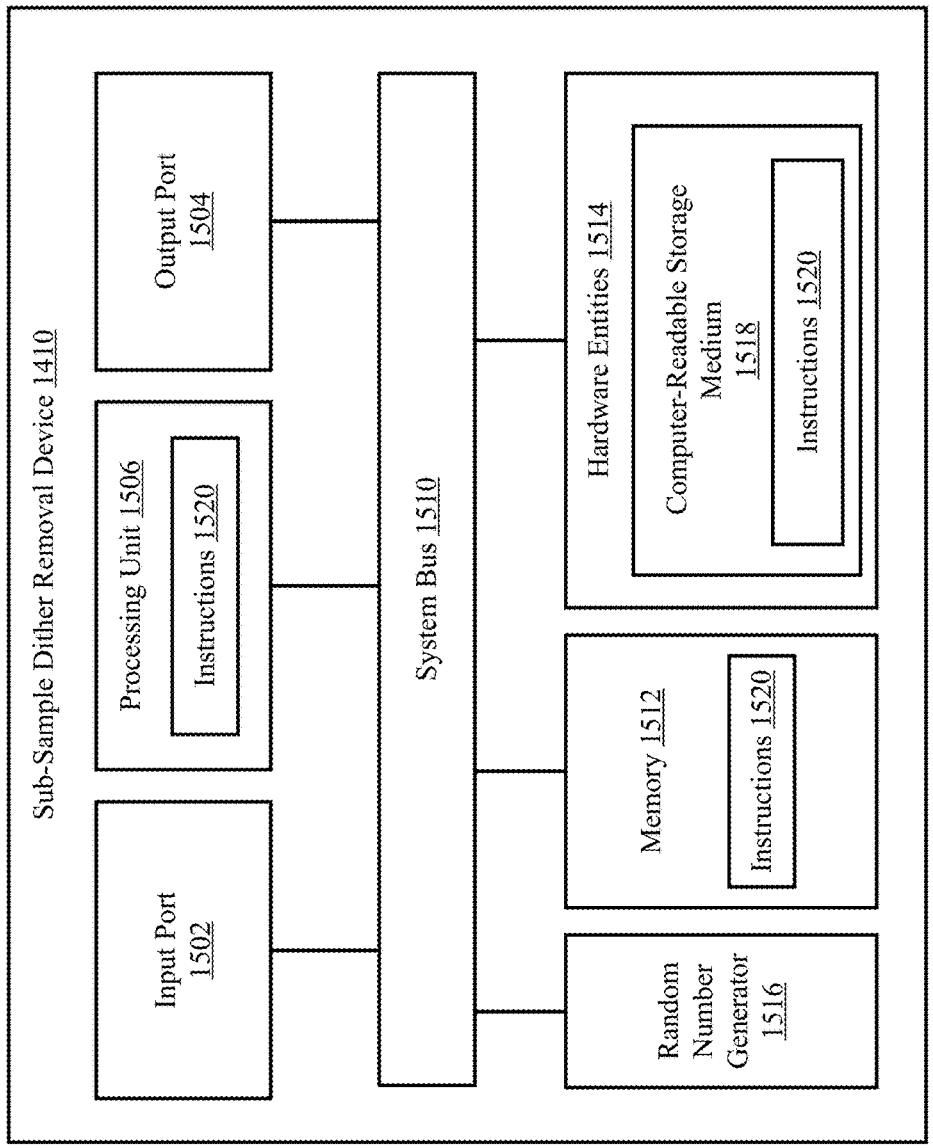
FIG. 15 is an illustration of an illustrative architecture for the sub-sample dithering processing device shown in FIG. 13.

The sub-sample dither removal device 1410 is generally configured to perform the inverse of the polyphase resampling filter operations 704 of the transmitter 404, and present a sequence of samples absent of any time advancements and/or time retardations to the following component(s) 1412, 1414. An illustrative architecture of the sub-sample dither removal device 1410 is provided in FIG. 15. FIG. 15 will be discussed below. The output of the sub-sample dither removal device 1410 is provided to subsequent devices 1412, 1414 in the receiver 406. These devices include an optional symbol de-spreader and a symbol demodulator. Symbol de-spreader and demodulators are well known in the art, and therefore will not be described herein.

Referring now to FIG. 15, there is provided a detailed block diagram of an illustrative architecture for the sub-sample dither removal device 1410. Device 1410 may include more or less components than those shown in FIG. 15. However, the components shown are sufficient to disclose an illustrative embodiment implementing the present solution. The hardware architecture of FIG. 15 represents one embodiment of a representative sub-sample dither removal device configured to facilitate cyclostationary feature elimination. As such, the device 1410 of FIG. 15 implements at least a portion of a method for selectively removing time advances and/or delays in a sequence of samples in accordance with the present solution.

Some or all components of the device 1410 can be implemented as hardware, software and/or a combination of hardware and software. The hardware includes, but is not limited to, one or more electronic circuits. The electronic circuits can include, but are not limited to, passive components (e.g., resistors and capacitors) and/or active components (e.g., amplifiers and/or microprocessors). The passive and/or active components can be adapted to, arranged to and/or programmed to perform one or more of the methodologies, procedures, or functions described herein.

As shown in FIG. 15, the device 1410 comprises an input port 1502, a processing unit 1506, an output port 1504, a system bus 1510, a random number generator 1516, a memory 1512 connected to and accessible by other portions of device 1410 through system bus 1510, and hardware entities 1514 connected to system bus 1510.

At least some of the hardware entities 1514 perform actions involving access to and use of memory 1512. Hardware entities 1514 can include a computer-readable storage medium 1518 on which is stored one or more sets of instructions 1520 (e.g., software code) configured to implement one or more of the methodologies, procedures, or functions described herein. The instructions 1520 can also reside, completely or at least partially, within the memory 1512 and/or within the processing unit 1506 during execution thereof by the device 1410. The memory 1512 and the processing unit 1506 also can constitute machine-readable media. The term "machine-readable media", as used here, refers to a single medium or multiple media that store the one or more sets of instructions 1520. The term "machine-readable media", as used here, also refers to any medium that is capable of storing, encoding or carrying a set of instructions 1520 for execution by the device 1410 and that cause the device 1410 to perform any one or more of the methodologies of the present disclosure.

Figure 16:
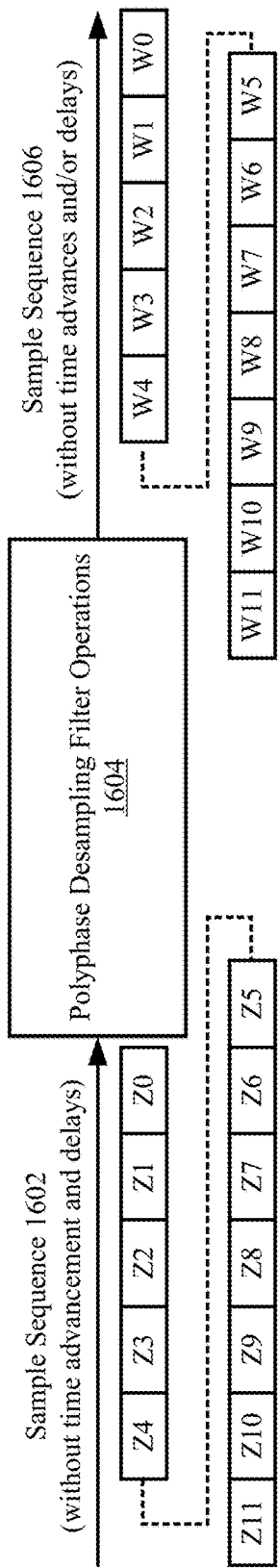
FIG. 16 is an illustration that is useful for understanding polyphase desampling filter operations performed by the sub-sample dithering processing device shown in FIG. 15.
Figure 17:
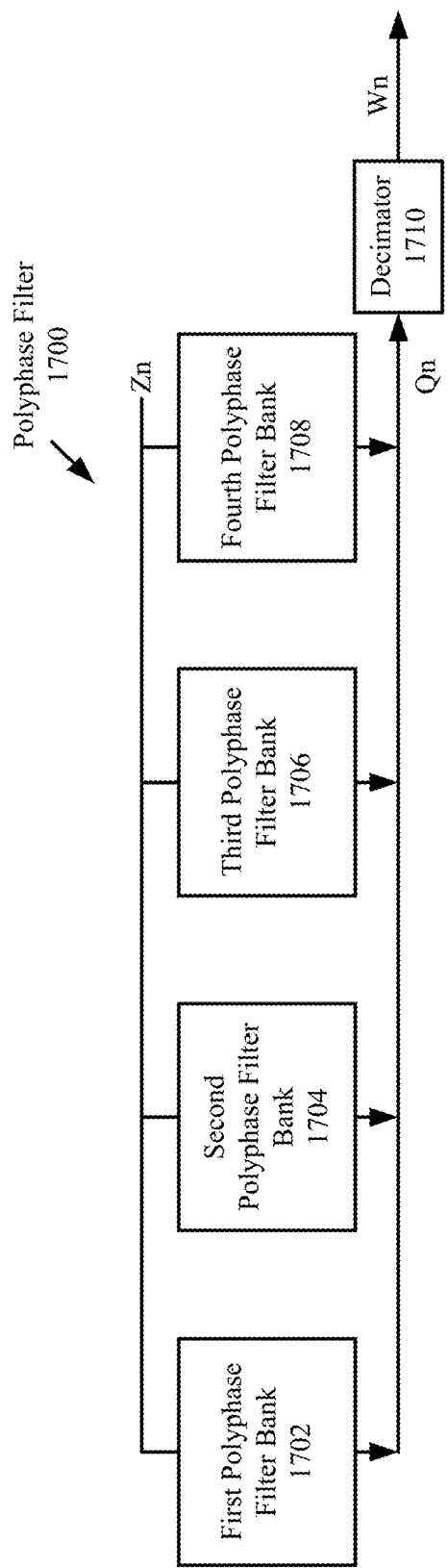
FIG. 17 is an illustration of an illustrative polyphase filter employed on a receive side.

Referring now to FIGS. 16-17, there are provided illustrations that are useful for understanding the operations performed by the sub-sample dither removal device 1410. The operations include polyphase desampling filter operations 1604 for selectively removing time advances and/or time retardations (or delays) in a received sequence of samples Z0, Z1, Z2, ..., Z11. The output of the polyphase desampling filter operations 1604 is referred to herein as a sequence of samples W0, W1, W2, ..., W11. Notably, the polyphase desampling filter operations 1604 outputs the same number of samples as it receives, i.e., there is a 1 to 1 correspondence between input samples and output samples. Although the sequence of samples is shown in FIG. 16 as comprising twelve samples, the present solution is not limited in this regard. The sequence of samples can comprise any number of samples in accordance with a given application.

The time advances/retardations are removed using a plurality of polyphase filter banks 1702, 1704, 1706, 1708 so that all samples output from the sub-sample dither removal device 1410 have the same duration. Polyphase filter banks are well known in the art, and therefore will not be described here in detail. Although four polyphase filter banks are shown in FIG. 17, the present solution is not limited in this regard. Any number of polyphase filter banks can be employed herein in accordance with a particular application. In some scenarios, 128 polyphase filter banks are provided, each with 12 coefficients, so that time advances and delays which are multiples of 1/128 of a sample duration can be chosen. The present solution is not limited in this regard.

Referring now to FIG. 18, there is an illustration showing the results from computations performed by the polyphase filter banks 1702, 1704, 1706, 1708. Each filter bank has four coefficients assigned thereto. More specifically, a first polyphase filter bank 1702 has coefficients C0, C4, C8 and C12 assigned thereto. A second polyphase filter bank 1704 has coefficients C1, C5, C9 and C13 assigned thereto. A third polyphase filter bank 1706 has coefficients C2, C6, C10 and C14 assigned thereto. A fourth polyphase filter bank 1708 has coefficients C3, C7, C11 and C15 assigned thereto.

Operation of this polyphase filter will be explained below in relation to a scenario in which there are only four input samples $Z_{n-k}$ and the $Z_{n-k}$ values are all initialized to zero values in the filter memory (not shown). This scenario is selected for ease and simplicity of discussion.

During operation, four input samples Z0, Z1, Z2 and Z3 are input into the polyphase filter. Operations of the first polyphase filter bank 1702 are defined by the following Mathematical Equations (43)-(46).

$$Q0=Z0*C0 \tag{43}$$

$$Q1=Z0*C4+Z1*C0 \tag{44}$$

$$Q2=Z0*C8+Z1*C4+Z2*C0 \tag{45}$$

$$Q3=Z0*C12+Z1*C8+Z2*C4+Z3*C0 \tag{46}$$

Operations of the second polyphase filter bank 1704 are defined by the following Mathematical Equations (47)-(50).

$$Q1=Z0*C1 \tag{47}$$

$$Q5=Z0*C5+Z1*C1 \tag{48}$$

$$Q9=Z0*C9+Z1*C5+Z2*C1 \tag{49}$$

$$Q13=Z0*C13+Z1*C9+Z2*C5+Z3*C1 \tag{50}$$

Operations of the third polyphase filter bank 1706 are defined by the following Mathematical Equations (51)-(54).

$$Q2=Z0*C2 \tag{51}$$

$$Q6=Z0*C6+Z1*C2 \tag{52}$$

$$Q10=Z0*C10+Z1*C6+Z2*C2 \tag{53}$$

$$Q14=Z0*C14+Z1*C10+Z2*C6+Z3*C2 \tag{54}$$

Operations of the second polyphase filter bank 1708 are defined by the following Mathematical Equations (55)-(58).

$$Q2=Z0*C3 \tag{55}$$

$$Q6=Z0*C7+Z1*C3 \tag{56}$$

$$Q10=Z0*C11+Z1*C7+Z2*C3 \tag{57}$$

$$Q14=Z0*C15+Z1*C11+Z2*C7+Z3*C3 \tag{58}$$

As evident from Mathematical Equations (43)-(58), for four input values Z0, Z1, X2 and Z3, there are sixteen resulting values Q0, Q2, ..., Q15. In some scenarios, all sixteen resulting values are computed. In other scenarios, only select ones of the sixteen resulting values are computed.

Referring now to FIG. 19, there is provided illustrations that are useful for understanding how the polyphase filter 1700 is used in accordance with the present solution. As noted above, the present solution is designed to introduce time advancements in a sequence of sample and/or time retardations in a sequence of samples using a polyphase filter at the transmit side. The inverse of these transmit side polyphase filter operations are performed at the receive side. In this regard, the polyphase filter 1700 is used at the receive side to remove time advancements and/or time retardations from a received sequence of samples. The manner in which time advancements are removed will now be discussed in relation to FIG. 19. The manner in which time retardations are removed are discussed below in relation to FIG. 20.

Referring now to FIG. 19, time advancements will be discussed in relation to a scenario where: (1) four polyphase filter banks 1702-1708 are employed, each with four coefficients assigned thereto; and (2) there are only four input samples and the $Z_{n-k}$ values are all initialized to zero values in the filter memory (not shown).

Figure 19A:
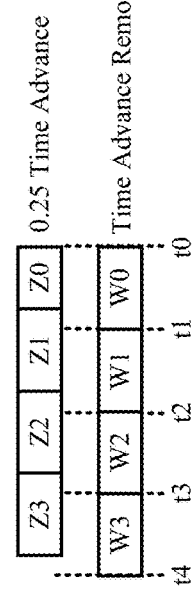
FIGS. 19A-19D (collectively referred to as "FIG. 19") provide illustrations that are useful for understanding how time advancements are removed from a signal at the receiver of FIG. 4.

Referring now to FIG. 19A, a relative time advancement equal to a quarter (0.25) of a sample duration is removed by performing a time retardation equal to quarter (0.25) of a sample duration. Such a time retardation is achieved by selecting the outputs of the first and second polyphase filter banks 1702, 1704, and discarding (A) the outputs of the other polyphase filter banks 1706, 1708, (B) the second, third and fourth outputs of the first polyphase filter bank 1702, and (C) the first output of the second polyphase filter banks 1704. In this case, the output of the polyphase resampling filter operations 1604 of FIG. 16 comprises W0-W3 defined by the following Mathematical Equations (59)-(62).

$$W0=Z0*C0 \tag{59}$$

$$W1=Z0*C5+Z1*C1 \tag{60}$$

$$W2=Z0*C9+Z1*C5+Z2*C1 \tag{61}$$

$$W3=Z0*C13+Z1*C9+Z2*C5+Z3*C1 \tag{62}$$

The first output sample W0 has a 0.25 longer sample duration than that of the corresponding input sample Z0, i.e., the 0.25 time advancement has been removed. In effect, all of the output samples W0-W3 have the same sample duration.

Figure 19B:
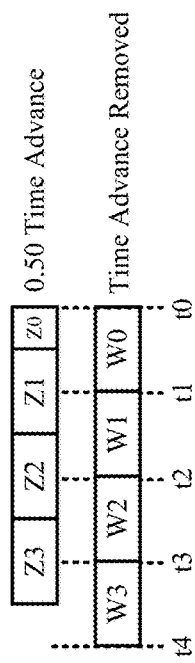

As shown in FIG. 19B, a relative time advancement equal to a half (0.50) of a sample duration is removed by performing a time retardation equal to a half (0.50) of a sample duration. Such a time retardation is achieved by selecting the outputs of the first and third polyphase filter banks 1702, 1706, and discarding (A) the outputs of the other polyphase filter banks 1704, 1708, (B) the second, third and fourth outputs of the first polyphase filter bank 1702, and (C) the first output of the third polyphase filter banks 1706. In this case, the output of the polyphase resampling filter operations 1604 of FIG. 16 comprises Z0-Z3 defined by the following Mathematical Equations (63)-(66).

$$W0=Z0*C0 \tag{63}$$

$$W1=Z0*C6+Z1*C2 \tag{64}$$

$$W2=Z0*C10+Z1*C6+Z2*C2 \tag{65}$$

$$W3=Z0*C14+Z1*C10+Z2*C6+Z3*C2 \tag{66}$$

The first output sample W0 has a 0.50 longer sample duration than that of the corresponding input sample Z0, i.e., the 0.50 time advancement has been removed. In effect, samples W0-W3 have the same sample duration.

Figure 19C:
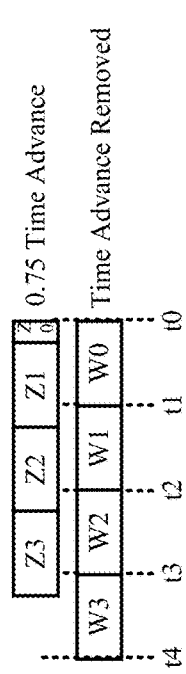

As shown in FIG. 19C, a relative time advancement equal to three quarters (0.75) of a sample duration is removed by performing a time retardation equal to three quarters (0.75) of a sample duration. Such a time retardation is achieved by selecting the outputs of the first and fourth polyphase filter banks 1702, 1708, and discarding (A) the outputs of the other polyphase filter banks 1704, 1706, (B) the second, third and fourth outputs of the first polyphase filter bank 1702, and (C) the first output of the fourth polyphase filter banks 1708. In this case, the output of the polyphase resampling filter operations 1604 of FIG. 16 comprises W0-W3 defined by the following Mathematical Equations (67)-(70).

$$W0=Z0*C0 \tag{67}$$

$$W1=Z0*C7+Z1*C3 \tag{68}$$

$$W2=Z0*C11+Z1*C7+Z2*C3 \tag{69}$$

$$W3=Z0*C15+Z1*C11+Z2*C7+Z3*C3 \tag{70}$$

The first output sample W0 has a 0.75 longer sample duration than that of the corresponding input sample Z0, i.e., the 0.75 time advancement has been removed. In effect, samples W0-W3 have the same sample duration.

Figure 19D:
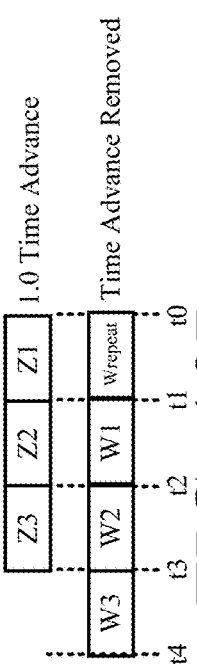

Referring now to FIG. 19D, a relative time advancement equal to one (1.00) sample duration is removed by performing a time retardation equal to one (1.00) sample duration. Such a time retardation is achieved by performing first polyphase filter bank computations and repeating a previous sample. In this case, the output of the polyphase resampling filter operations 1604 of FIG. 16 comprises W0-W3 defined by the following Mathematical Equations (71)-(74).

$$W0=Z0*C0 \tag{71}$$

$$W1=Z0*C4+Z1*C0 \tag{72}$$

$$W2=Z0*C8+Z1*C4+Z2*C0 \tag{73}$$

$$W3=Z0*C12+Z1*C8+Z2*C4+Z3*C0 \tag{74}$$

The output samples W1-W3 are shifted in time by one sample duration. A sample output immediately prior to W1 is repeated as shown by Wrepeat.

Referring now to FIG. 20, time retardations will be discussed in relation to a scenario where: (1) four polyphase filter banks 1702-1708 are employed, each with four coefficients assigned thereto; and (2) there are only four input samples and the $Z_{n-k}$ values are all initialized to zero values in the filter memory (not shown).

Figure 20A:
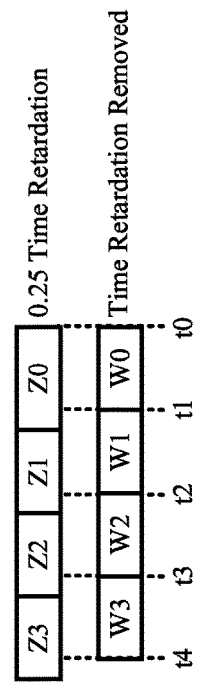
FIGS. 20A-20C (collectively referred to as "FIG. 20") provide illustrations that are useful for understanding how time retardations are removed from a signal at the receiver of FIG. 4.

Referring now to FIG. 20A, a relative time retardation equal to 0.25 of a sample duration is removed by performing a time advancement equal to 0.25 of a sample duration. A time advance equal to a quarter (0.25) of a sample duration is achieved by selecting the outputs of the second polyphase filter bank 1704, and discarding the outputs of the other polyphase filter banks 1702, 1706, 1708. In this case, the output of the polyphase resampling filter operations 1604 of FIG. 16 comprises W1-W3 defined by the following Mathematical Equations (75)-(78).

$$W0=Z0*C1 \tag{75}$$

$$W1=Z0*C5+Z1*C1 \tag{76}$$

$$W2=Z0*C9+Z1*C5+Z2*C1 \tag{77}$$

$$W3=Z0*C13+Z1*C9+Z2*C5+Z3*C1 \tag{78}$$

The first output sample W0 has a 0.25 shorter sample duration than that of the corresponding input sample Z0, i.e., the 0.25 time retardation has been removed. In effect, samples W0-W3 have the same sample duration.

Figure 20B:
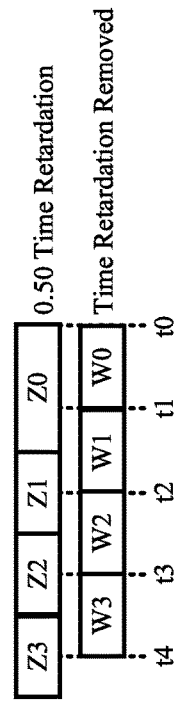

Referring now to FIG. 20B, a relative time retardation equal to 0.50 of a sample duration is removed by performing a time advancement equal to 0.50 of a sample duration. A time advance equal to a half (0.50) of a sample duration is achieved by selecting the outputs of the third polyphase filter bank 1706, and discarding the outputs of the other polyphase filter banks 1702, 1704, 1708. In this case, the output of the polyphase resampling filter operations 1604 of FIG. 16 comprises W1-W3 defined by the following Mathematical Equations (79)-(82).

$$W0=Z0*C2 \tag{79}$$

$$W1=Z0*C6+Z1*C2 \tag{80}$$

$$W2=Z0*C10+Z1*C6+Z2*C2 \tag{81}$$

$$W3=Z0*C14+Z1*C10+Z2*C6+Z3*C2 \tag{82}$$

The first output sample W0 has a 0.50 shorter sample duration than that of the corresponding input sample Z0, i.e., the 0.50 time retardation has been removed. In effect, samples W0-W3 have the same sample duration.

Figure 20C:
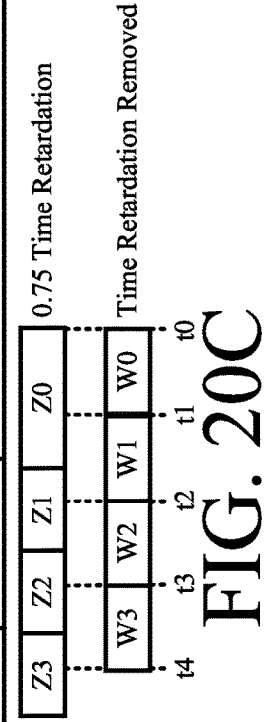

Referring now to FIG. 20C, a relative time retardation equal to 0.75 of a sample duration is removed by performing a time advancement equal to 0.75 of a sample duration. A time advance equal to three quarters (0.75) of a sample duration is achieved by selecting the outputs of the fourth polyphase filter bank 1708, and discarding the outputs of the other polyphase filter banks 1702, 1704, 1706. In this case, the output of the polyphase resampling filter operations 1604 of FIG. 16 comprises W1-W3 defined by the following Mathematical Equations (83)-(86).

$$W0=Z0*C3 \tag{83}$$

$$W1=Z0*C7+Z1*C3 \tag{84}$$

$$W2=Z0*C11+Z1*C7+Z2*C3 \tag{85}$$

$$W3=Z0*C15+Z1*C11+Z2*C7+Z3*C3 \tag{86}$$

The first output sample W0 has a 0.75 shorter sample duration than that of the corresponding input sample Z0, i.e., the 0.75 time retardation has been removed. In effect, samples W0-W3 have the same sample duration.

Figure 21:
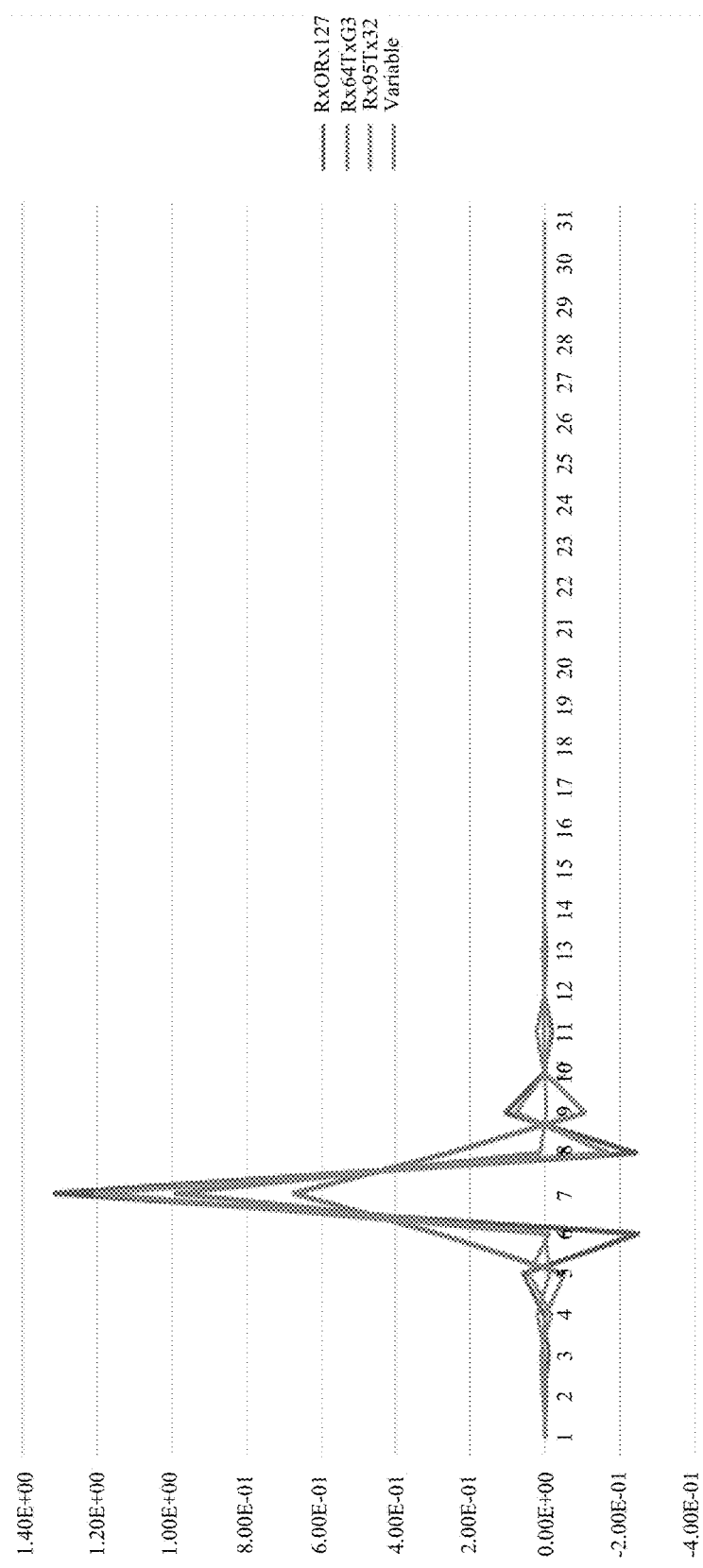
FIG. 21, there is provided a graph useful for understanding operations of the present solution.

Referring now to FIG. 21, there is provided a graph that is useful for understanding the present solution. A polyphase resampler at the receiver will line up the impulse response (at the receiver) so that the demodulation will appear stationary in time. This is accomplished when the transmitter timing is advanced (for example) and the receiver timing is retarded by the exact same amount. If a 128 bank resampler is used (for example) a transmit choice of tap 32 will lead to a receive offset of tap 96.

Since the polyphase filter banks are not the same, a perfect matched filter is not provided at the receiver as shown by FIG. 21. If the transmitter selected polyphase filter bank one, then the receiver will use polyphase filter bank three to inverse the polyphase filter operations performed at the transmitter. The coefficients of the first and third polyphase filter banks are different. Therefore, the sample value generated at the receiver is different than the sample value generated at the transmitter, but the delay lines up. In effect, the Bit Error Rate ("BER") is not perfectly recovered.

Referring now to FIG. 22, there is provided another graph showing the slight degradation of the BER for a communications system implementing the present solution. Line 2200 shows the BER for a system employing a standard uncoded orthogonal communications scheme (i.e., no dithering performed). Line 2202 shows the BER for a system employing an technique in which a perfectly matched filter is employed by the transmitter and receiver. Line 2204 shows the BER for a system implementing the present solution. As evident from lines 2202 and 2204, there is a 0.25 dB degradation of the BER in the system implementing the present solution as compared to the system having a perfectly matched filter.

All of the apparatus, methods, and algorithms disclosed and claimed herein can be made and executed without undue experimentation in light of the present disclosure. While the invention has been described in terms of preferred embodiments, it will be apparent to those having ordinary skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those having ordinary skill in the art are deemed to be within the spirit, scope and concept of the invention as defined.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

We claim:

1. A method for removing dither introduced into a transmitted radio frequency (RF) signal, comprising:
   receiving, by a receiver, the transmitted RF signal;
   converting, by the receiver, the transmitted RF signal into a discrete-time intermediate frequency (IF) signal comprising a sequence of samples, where at least a first sample of said samples has a first sample duration different than a second sample duration of at least a second sample of said samples; and
   performing operations by a sub-sample dither removal device of the receiver to modify a sample timing of the discrete-time IF signal by decreasing or increasing the first sample duration of the first sample using a digital signal processing technique in a digital domain;
   wherein the first sample duration of the first sample is increased or decreased by a first amount different than a second amount by which a third sample of said samples duration of a third sample is increased or decreased.

2. The method according to claim 1, wherein the digital signal processing technique comprises a polyphase resampling filter technique, a sample dropping/repeating technique, or a Farrow filter technique that adds or drops a plurality of samples from the discrete-time IF signal.

3. A method for removing dither introduced into a transmitted radio frequency (RF) signal, comprising:
   receiving, by a receiver, the transmitted RF signal;
   converting, by the receiver, the transmitted RF signal into a discrete-time intermediate frequency (IF) signal comprising a sequence of samples, where at least a first sample of said samples has a first sample duration different than a second sample duration of at least a second sample of said samples; and
   performing operations by a sub-sample dither removal device of the receiver to modify a sample timing of the discrete-time IF signal by decreasing or increasing the first sample duration of the first sample using a digital signal processing technique in a digital domain;
   wherein:
      the first sample duration of the first sample is longer than the second sample duration of the second sample; and
      the first sample duration is decreased by a first incremental amount of a sample duration by outputting results only from a first select one of a plurality of polyphase filter banks from the sub-sample dither removal device.

4. The method according to claim 3, wherein results from all unselected ones of the poyphase filter banks are discarded or not computed.

5. The method according to claim 3, wherein the duration of at least one third sample of the sequence is decreased by a second incremental amount of the sample duration by outputting results only from a second select one of the plurality of polyphase filter banks from the sub-sample dither removal device.

6. A method for removing dither introduced into a transmitted radio frequency (RF) signal, comprising:
   receiving, by a receiver, the transmitted RF signal;
   converting, by the receiver, the transmitted RF signal into a discrete-time intermediate frequency (IF) signal comprising a sequence of samples, where at least a first sample of said samples has a first sample duration different than a second sample duration of at least a second sample of said samples; and
   performing operations by a sub-sample dither removal device of the receiver to modify a sample timing of the discrete-time IF signal by decreasing or increasing the first sample duration of the first sample using a digital signal processing technique in a digital domain;
   wherein:
      the first sample duration of the first sample is shorter than the second sample duration of the second sample; and
      the first sample duration is increased by a first incremental amount of a sample duration by outputting only one result from a first select one of a plurality of polyphase filter banks of the sub-sample dither removal device, immediately followed by at least one result from a second different select one of the plurality of polyphase filter banks.

7. The method according to claim 6, wherein the duration of at least one third sample of the sequence is increased by a second incremental amount of the sample duration by outputting only one result from the first select one of a plurality of polyphase filter banks of the sub-sample dither removal device, immediately followed by at least one result from a third different select one of the plurality of polyphase filter banks.

8. A method for removing dither introduced into a transmitted radio frequency (RF) signal, comprising:
receiving, by a receiver, the transmitted RF signal;
converting, by the receiver, the transmitted RF signal into a discrete-time intermediate frequency (IF) signal comprising a sequence of samples, where at least a first sample of said samples has a first sample duration different than a second sample duration of at least a second sample of said samples; and
performing operations by a sub-sample dither removal device of the receiver to modify a sample timing of the discrete-time IF signal by decreasing or increasing the first sample duration of the first sample using a digital signal processing technique in a digital domain;
wherein a time advance equal to one sample duration is removed from the discrete-time IF signal at the sub-sample dither removal device by repeating a sample in a sequence of output samples.

9. A method for removing dither introduced into a transmitted radio frequency (RF) signal, comprising:
receiving, by a receiver, the transmitted RF signal;
converting, by the receiver, the transmitted RF signal into a discrete-time intermediate frequency (IF) signal comprising a sequence of samples, where at least a first sample of said samples has a first sample duration different than a second sample duration of at least a second sample of said samples; and
performing operations by a sub-sample dither removal device of the receiver to modify a sample timing of the discrete-time IF signal by decreasing or increasing the first sample duration of the first sample using a digital signal processing technique in a digital domain;
wherein a time advance equal to an amount of a sample duration is removed from the discrete-time IF signal at the sub-sample dither removal device by introducing a time retardation equal to the amount of the sample duration into the discrete-time IF signal.

10. A method for removing dither introduced into a transmitted radio frequency (RF) signal, comprising:
receiving, by a receiver, the transmitted RF signal;
converting, by the receiver, the transmitted RF signal into a discrete-time intermediate frequency (IF) signal comprising a sequence of samples, where at least a first sample of said samples has a first sample duration different than a second sample duration of at least a second sample of said samples; and
performing operations by a sub-sample dither removal device of the receiver to modify a sample timing of the discrete-time IF signal by decreasing or increasing the first sample duration of the first sample using a digital signal processing technique in a digital domain;
wherein a time retardation equal to an amount of a sample duration is removed from the discrete-time IF signal at the sub-sample dither removal device by introducing a time advancement equal to the amount of the sample duration into the discrete-time IF signal.

11. A receiver, comprising:
an antenna configured to receive a transmitted radio frequency (RF) signal into which dither has been introduced;
a converter configured to convert the transmitted RF signal into a discrete-time intermediate frequency (IF) signal comprising a sequence of samples, where at least a first sample of said samples has a first sample duration different than a second sample duration of at least a second sample of said samples; and
a sub-sample dither removal device configured to perform operations to modify a sample timing of the discrete-time IF signal by decreasing or increasing the first sample duration of the first sample using a digital signal processing technique in a digital domain;
wherein the first sample duration of the first sample is increased or decreased by a first amount different than a second amount by which a third sample of said samples duration of a third sample is increased or decreased.

12. The receiver according to claim 11, wherein the digital signal processing technique comprises a polyphase resampling filter technique, a sample dropping/repeating technique, or a Farrow filter technique that adds or drops a plurality of samples from the discrete-time IF signal.

13. A receiver, comprising:
an antenna configured to receive a transmitted radio frequency (RF) signal into which dither has been introduced;
a converter configured to convert the transmitted RF signal into a discrete-time intermediate frequency (IF) signal comprising a sequence of samples, where at least a first sample of said samples has a first sample duration different than a second sample duration of at least a second sample of said samples; and
a sub-sample dither removal device configured to perform operations to modify a sample timing of the discrete-time IF signal by decreasing or increasing the first sample duration of the first sample using a digital signal processing technique in a digital domain;
wherein:
the first sample duration of the first sample is longer than the second sample duration of the second sample; and
the first sample duration is decreased by a first incremental amount of a sample duration by outputting results only from a first select one of a plurality of polyphase filter banks from the sub-sample dither removal device.

14. The receiver according to claim 13, wherein results from all unselected ones of the poyphase filter banks are discarded or not computed.

15. The receiver according to claim 13, wherein the duration of at least one third sample of the sequence is decreased by a second incremental amount of the sample duration by outputting results only from a second select one of the plurality of polyphase filter banks from the sub-sample dither removal device.

16. A receiver, comprising:
an antenna configured to receive a transmitted radio frequency (RF) signal into which dither has been introduced;
a converter configured to convert the transmitted RF signal into a discrete-time intermediate frequency (IF) signal comprising a sequence of samples, where at least a first sample of said samples has a first sample duration different than a second sample duration of at least a second sample of said samples; and a sub-sample dither removal device configured to perform operations to modify a sample timing of the discrete-time IF signal by decreasing or increasing the first sample duration of the first sample using a digital signal processing technique in a digital domain;
wherein:
 the first sample duration of the first sample is shorter than the second sample duration of the second sample; and
 the first sample duration is increased by a first incremental amount of a sample duration by outputting only one result from a first select one of a plurality of polyphase filter banks of the sub-sample dither removal device, immediately followed by at least one result from a second different select one of the plurality of polyphase filter banks.

17. The receiver according to claim 16, wherein the duration of at least one third sample of the sequence is increased by a second incremental amount of the sample duration by outputting only one result from the first select one of a plurality of polyphase filter banks of the sub-sample dither removal device, immediately followed by at least one result from a third different select one of the plurality of polyphase filter banks.

18. A receiver, comprising:
an antenna configured to receive a transmitted radio frequency (RF) signal into which dither has been introduced;
a converter configured to convert the transmitted RF signal into a discrete-time intermediate frequency (IF) signal comprising a sequence of samples, where at least a first sample of said samples has a first sample duration different than a second sample duration of at least a second sample of said samples; and
a sub-sample dither removal device configured to perform operations to modify a sample timing of the discrete-time IF signal by decreasing or increasing the first sample duration of the first sample using a digital signal processing technique in a digital domain;
wherein a time advance equal to one sample duration is removed from the discrete-time IF signal at the sub-sample dither removal device by repeating a sample in a sequence of output samples.

19. A receiver, comprising:
an antenna configured to receive a transmitted radio frequency (RF) signal into which dither has been introduced;
a converter configured to convert the transmitted RF signal into a discrete-time intermediate frequency (IF) signal comprising a sequence of samples, where at least a first sample of said samples has a first sample duration different than a second sample duration of at least a second sample of said samples; and
a sub-sample dither removal device configured to perform operations to modify a sample timing of the discrete-time IF signal by decreasing or increasing the first sample duration of the first sample using a digital signal processing technique in a digital domain;
wherein a time advance equal to an amount of a sample duration is removed from the discrete-time IF signal at the sub-sample dither removal device by introducing a time retardation equal to the amount of the sample duration into the discrete-time IF signal.

20. A receiver, comprising:
an antenna configured to receive a transmitted radio frequency (RF) signal into which dither has been introduced;
a converter configured to convert the transmitted RF signal into a discrete-time intermediate frequency (IF) signal comprising a sequence of samples, where at least a first sample of said samples has a first sample duration different than a second sample duration of at least a second sample of said samples; and
a sub-sample dither removal device configured to perform operations to modify a sample timing of the discrete-time IF signal by decreasing or increasing the first sample duration of the first sample using a digital signal processing technique in a digital domain;
wherein a time retardation equal to an amount of a sample duration is removed from the discrete-time IF signal at the sub-sample dither removal device by introducing a time advancement equal to the amount of the sample duration into the discrete-time IF signal.

* * * * *